(12) United States Patent
Son et al.

(10) Patent No.: US 12,517,440 B2
(45) Date of Patent: Jan. 6, 2026

(54) IRRADIATING MODULE, AND SUBSTRATE TREATING APPARATUS INCLUDING THE SAME

(71) Applicant: SEMES CO., LTD., Cheonan-si (KR)

(72) Inventors: Won Sik Son, Yongin-si (KR); Hyun Yoon, Hwaseong-si (KR); Ki Hoon Choi, Cheonan-si (KR); Hyo Won Yang, Seoul (KR); Tae Hee Kim, Yongin-si (KR); In Ki Jung, Hwaseong-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 804 days.

(21) Appl. No.: 17/864,506

(22) Filed: Jul. 14, 2022

(65) Prior Publication Data
US 2023/0205100 A1  Jun. 29, 2023

(30) Foreign Application Priority Data

Dec. 28, 2021 (KR) ........................ 10-2021-0189873

(51) Int. Cl.
*G03F 7/00* (2006.01)
*H01L 21/67* (2006.01)
*H01L 21/687* (2006.01)

(52) U.S. Cl.
CPC .... *G03F 7/70891* (2013.01); *H01L 21/67023* (2013.01); *H01L 21/67115* (2013.01); *H01L 21/68764* (2013.01)

(58) Field of Classification Search
CPC ...... G01J 1/4257; G01J 1/0271; G01J 1/0418; G01J 1/0488; G03F 7/2053; G03F 1/84;
(Continued)

(56) References Cited

U.S. PATENT DOCUMENTS

2005/0132914 A1* 6/2005 Mulkens ............. G03F 7/70341
  101/463.1
2005/0153424 A1* 7/2005 Coon .................. G03F 7/70808
  355/403
(Continued)

FOREIGN PATENT DOCUMENTS

JP    H01-251612 A    10/1989
JP    2000-331914 A   11/2000
(Continued)

OTHER PUBLICATIONS

Korean Office Action dated Mar. 29, 2024 issued in corresponding Korean Appln. No. 10-2021-0189873.
(Continued)

*Primary Examiner* — Caleen O Sullivan
(74) *Attorney, Agent, or Firm* — Harness, Dickey & Pierce, P.L.C.

(57) ABSTRACT

The present invention provides a substrate treating apparatus including: a support unit supporting and rotating the substrate in a treatment space; a liquid supply unit supplying a liquid to the substrate supported by the support unit; and an irradiating module irradiating light to the substrate supported by the support unit, in which the irradiating module includes: a housing having an accommodation space; a laser unit located in the accommodation space, and including a laser irradiation unit irradiating laser light, and an irradiation end having one end protruding from the housing and irradiating the laser light irradiated from the laser irradiation unit to the substrate supported by the support unit; and a cooling unit located in the accommodation space and cooling the laser irradiation unit.

20 Claims, 12 Drawing Sheets

(58) Field of Classification Search
CPC . G03F 7/7085; G03F 1/42; G03F 1/44; G03F 1/82; G03F 7/20; G03F 7/70; G03F 7/70616; G03F 9/7073; G03F 9/7088; G03F 1/80; B23K 26/0876; B23K 26/705; H01L 21/6708; H01L 21/67115; H01L 21/67242
USPC ........... 430/7, 30; 355/402, 403, 53, 106, 67
See application file for complete search history.

(56) References Cited

U.S. PATENT DOCUMENTS

| | | | | |
|---|---|---|---|---|
| 2009/0262322 | A1* | 10/2009 | Novak | G03F 7/70641 355/67 |
| 2020/0353570 | A1* | 11/2020 | Lu | B23K 26/0622 |
| 2023/0152706 | A1* | 5/2023 | Choi | H01L 21/67051 355/67 |

FOREIGN PATENT DOCUMENTS

| | | |
|---|---|---|
| JP | 2003-520977 A | 7/2003 |
| JP | 2004-014726 A | 1/2004 |
| JP | 2016-043293 A | 4/2016 |
| JP | 2020-079896 A | 5/2020 |

OTHER PUBLICATIONS

Japanese Office Action dated Sep. 12, 2023 issued in corresponding Japanese Patent Application No. 2022-186019.

* cited by examiner

IRRADIATING MODULE, AND SUBSTRATE TREATING APPARATUS INCLUDING THE SAME

CROSS-REFERENCE TO RELATED APPLICATIONS

This application claims priority to and the benefit of Korean Patent Application No. 10-2021-0189873 filed in the Korean Intellectual Property Office on Dec. 28, 2021, the entire contents of which are incorporated herein by reference.

TECHNICAL FIELD

The present invention relates to an irradiating module and a substrate treating apparatus including the same, and more particularly, to a substrate treating apparatus including an irradiating module which irradiates light to a substrate.

BACKGROUND ART

A photography process for forming a pattern on a wafer includes an exposure process. The exposure process is a preliminary operation for scraping a semiconductor integrated material adhered on the wafer into a desired pattern. The exposure process may have various purposes, such as forming a pattern for etching and forming a pattern for ion implantation. In the exposure process, a pattern is drawn with light on the wafer by using a mask, which is a kind of 'frame'. When the semiconductor integrated material on a wafer, for example, a resist on the wafer, is exposed to light, chemical properties of the resist are changed according to a pattern by the light and the mask. When a developer is supplied to the resist whose chemical properties are changed according to the pattern, a pattern is formed on the wafer.

In order to precisely perform the exposure process, the pattern formed on the mask needs to be precisely manufactured. Whether the pattern is formed satisfactorily under the required process conditions needs to be checked. A large number of patterns are formed on one mask. Accordingly, it takes a lot of time for an operator to inspect all of a large number of patterns in order to inspect one mask. Accordingly, a monitoring pattern that may represent one pattern group including a plurality of patterns is formed on the mask. In addition, an anchor pattern that may represent a plurality of pattern groups is formed on the mask. The operator may estimate the quality of the patterns included in one pattern group through the inspection of the monitoring pattern. In addition, the operator may estimate the quality of the patterns formed on the mask through the inspection of the anchor pattern.

In addition, in order to increase the inspection accuracy of the mask, it is preferable that the critical dimensions of the monitoring pattern and the anchor pattern are the same. A critical dimension correction process for precisely correcting the line widths of the patterns formed on the mask is additionally performed.

FIG. 1 shows a normal distribution with respect to a first critical dimension CDP1 of a monitoring pattern and a second critical dimension CDP2 of an anchor pattern of a mask before a critical dimension correction process is performed during a mask manufacturing process. In addition, the first critical dimension CDP1 and the second critical dimension CDP2 have sizes smaller than a target critical dimension. Before the critical dimension correction process is performed, there is a deliberate deviation in the Critical Dimensions (CDs) of the monitoring pattern and the anchor pattern. Then, by additionally etching the anchor pattern in the critical dimension correction process, the critical dimensions of the two patterns are made the same. When the anchor pattern is over-etched than the monitoring pattern in the process of additionally etching the anchor pattern, the critical dimension of the patterns formed on the mask cannot be precisely corrected due to the difference in the critical dimension between the monitoring pattern and the anchor pattern. When the anchor pattern is additionally etched, precise etching of the anchor pattern needs to be accompanied.

In order to precisely etch the anchor pattern, the angle and output of light irradiated to the anchor pattern needs to be precisely controlled. When particles or treatment liquid droplets generated during the process are attached to an irradiator which irradiates light to the anchor pattern, the angle of the light irradiated to the anchor pattern is changed, and the light irradiation path is changed. Accordingly, the profile of the light irradiated to the anchor pattern may be changed. For this reason, precise etching of the anchor pattern cannot be performed. In addition, particles or droplets adhering to the irradiator cause corrosion of the irradiator and act as a factor deteriorating the durability of the irradiator. In addition, the irradiator for irradiating light to the anchor pattern is heated during the process. If the temperature of the irradiator is left to rise, damage to the irradiator occurs due to heat. This leads to an increase in maintenance cost and the inability to perform a process on the substrate during the maintenance period, resulting in poor substrate treating efficiency.

SUMMARY OF THE INVENTION

The present invention has been made in an effort to provide an irradiating module capable of efficiently treating a substrate and a substrate treating apparatus including the same.

The present invention has also been made in an effort to provide an irradiating module capable of performing precise etching on a substrate and a substrate treating apparatus including the same.

The present invention has also been made in an effort to provide an irradiating module capable of efficiently cooling the irradiating module and, at the same time, minimizing damage to the irradiating module due to particles generated during a process, and a substrate treating apparatus including the same.

The present invention has also been made in an effort to provide an irradiating module capable of minimizing damage to a liquid film formed on a substrate when the substrate is heated, and a substrate treating apparatus including the same.

The problem to be solved by the present invention is not limited to the above-mentioned problems, and the problems not mentioned will be clearly understood by those skilled in the art from the present specification and the accompanying drawings.

An exemplary embodiment of the present invention provides a substrate treating apparatus, including: a support unit supporting and rotating the substrate in a treatment space; a liquid supply unit supplying a liquid to the substrate supported by the support unit; and an irradiating module irradiating light to the substrate supported by the support unit, in which the irradiating module includes: a housing having an accommodation space; a laser unit located in the accommodation space, and including a laser irradiation unit irradiating laser light, and an irradiation end having one end protruding from the housing and irradiating the laser light irradiated from the laser irradiation unit to the substrate supported by the support unit; and a cooling unit located in the accommodation space and cooling the laser irradiation unit.

According to the exemplary embodiment, the substrate treating apparatus may further include a cover having an inner space, and formed so that one end of the irradiation end protruding from the housing is located in the inner space, in which an opening may be formed at a position overlapping the laser light irradiated from the irradiation end on a bottom surface of the cover when viewed from the top.

According to the exemplary embodiment, the opening may be formed to be rounded from an upper end of the bottom surface to a lower end of the bottom surface.

According to the exemplary embodiment, one or a plurality of side holes may be further formed on a side surface of the cover.

According to the exemplary embodiment, the cooling unit may include a plate having a flow path through which a cooling fluid flows therein, and the cooling fluid passing through the flow path may flow into the inner space.

According to the exemplary embodiment, one end of the flow path may be located between an outer surface of the irradiation end and an inner surface of the housing.

According to the exemplary embodiment, a purge port connected to one end of the flow path may be formed at a lower end of the housing, and a supply port supplying the cooling fluid to the inner space may be formed on a side surface of the cover, and the substrate treating apparatus may further include a flow cover which is coupled to the side surface of the cover to connect the purge port and the supply port, and has a flow space in which the cooling fluid flows therein.

According to the exemplary embodiment, the supply port may be provided at a position spaced apart from a central axis of the irradiation end when viewed from the front.

According to the exemplary embodiment, the substrate treating apparatus may further include a photographing unit photographing the laser light irradiated from the laser unit, in which the photographing unit is disposed in the accommodation space.

According to the exemplary embodiment, the laser unit may further include a beam expander controlling a characteristic of the laser light irradiated by the laser irradiation unit, and the photographing unit may include: an image unit photographing the laser light irradiated by the laser unit and/or an image of the substrate; and a lighting unit providing light so that the image unit acquires the image, and when viewed from the top, an irradiation direction of the laser light, a photographing direction of the image unit, and an irradiation direction of the light may be coaxial.

Another exemplary embodiment of the present invention provides an irradiating module irradiating light to a substrate, the irradiating module including: a housing having an accommodation space; a laser unit located in the accommodation space, and including a laser irradiation unit irradiating laser light, and an irradiation end having one end protruding from the housing and irradiating the laser light irradiated from the laser irradiation unit to the substrate supported by the support unit; and a cooling unit located in the accommodation space and exchanging heat with the laser irradiation unit.

According to the exemplary embodiment, the irradiating module may further include a cover having an inner space, and formed so that one end of the irradiation end protruding from the housing is located in the inner space, in which an opening is formed at a position overlapping the laser light irradiated from the irradiation end on a bottom surface of the cover when viewed from the top.

According to the exemplary embodiment, the cooling unit may include: a flow path through which a cooling fluid exchanging heat with the laser irradiation unit flows; and a plate in which the flow path is disposed, and the plate may be in contact with the laser irradiation unit.

According to the exemplary embodiment, the cooling fluid passing through the flow path may be supplied to the inner space.

According to the exemplary embodiment, the opening may be formed to be curved from an upper end of the bottom surface to a lower end of the bottom surface.

According to the exemplary embodiment, at least one side hole may be further formed on a side surface of the cover.

Another exemplary embodiment of the present invention provides a substrate treating apparatus treating a mask including a plurality of cells, the substrate treating apparatus including: a support unit supporting and rotating a mask in which a first pattern is formed in the plurality of cells and a second pattern different from the first pattern is formed outside regions in which the cells are formed; a liquid supply unit supplying a liquid to the mask supported by the support unit; and an irradiating module irradiating light to the substrate supported by the support unit, in which the irradiating module includes: a housing having an accommodation space; a laser unit located in the accommodation space, and including a laser irradiation unit irradiating laser light, and an irradiation end having one end protruding from the housing and irradiating the laser light irradiated from the laser irradiation unit to the second pattern between the first pattern and the second pattern; a cooling unit located in the accommodation space and including a flow path exchanging heat with the laser irradiation unit flows; and a cover having an inner space, and formed so that one end of the irradiation end protruding from the housing is located in the inner space, and an opening is formed at a position overlapping the laser light irradiated from the irradiation end on a bottom surface of the cover when viewed from the top.

According to the exemplary embodiment, the cooling fluid passing through the flow path may be supplied to the inner space.

According to the exemplary embodiment, the opening may be formed to be rounded from an upper end of the bottom surface to a lower end of the bottom surface.

According to the exemplary embodiment, one or a plurality of side holes may be further formed on a side surface of the cover.

According to the exemplary embodiments of the present invention, it is possible to efficiently treat the substrate.

Further, according to the exemplary embodiments of the present invention, it is possible to perform precise etching on the substrate.

Further, according to the exemplary embodiments of the present invention, it is possible to efficiently cool the irradiating module, and at the same time minimize damage to the irradiating module by particles generated during the process.

Further, according to the exemplary embodiments of the present invention, it is possible to minimize damage to the liquid film formed on the substrate when the substrate is heated.

The effect of the present invention is not limited to the foregoing effects, and the not-mentioned effects will be clearly understood by those skilled in the art from the present specification and the accompanying drawings.

DETAILED DESCRIPTION

Figure 1:
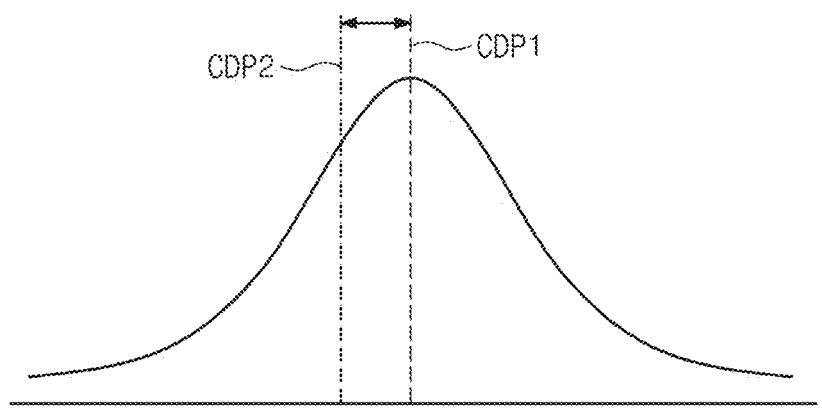
FIG. 1 is a diagram illustrating a normal distribution with respect to a critical dimension of a monitoring pattern and a critical dimension of an anchor pattern.

Hereinafter, an exemplary embodiment of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

Figure 2:
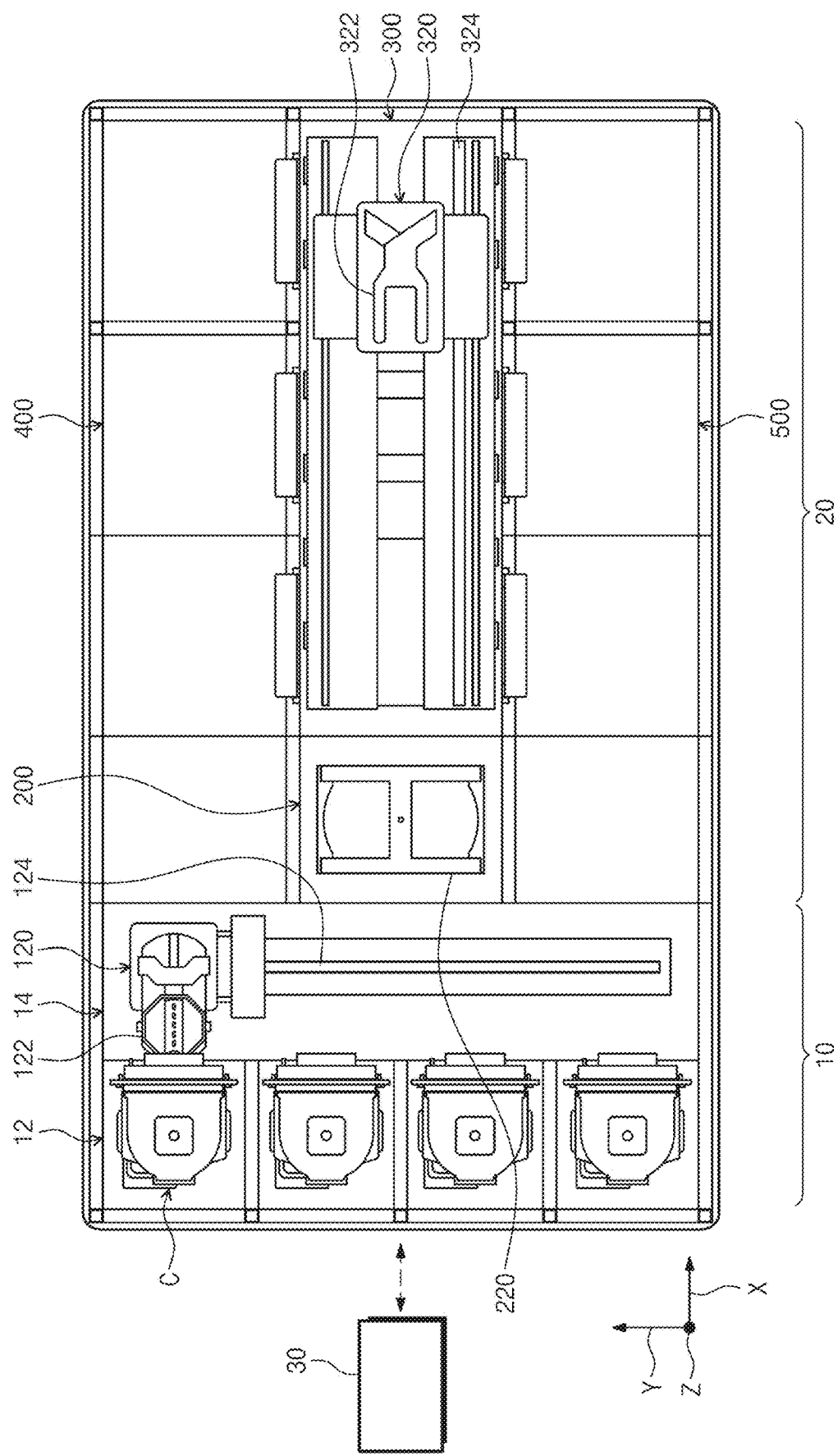
FIG. 2 is a diagram schematically illustrating a substrate treating apparatus according to an exemplary embodiment of the present invention.

Hereinafter, an exemplary embodiment of the present invention will be described in detail with reference to FIGS. 2 to 18. FIG. 2 is a diagram schematically illustrating a substrate treating apparatus according to an exemplary embodiment of the present invention.

Referring to FIG. 2, a substrate treating apparatus 1 includes an index module 10, a treating module 20, and a controller 30. According to the exemplary embodiment, the index module 10 and the treating module 20 may be disposed along one direction when viewed from the top.

Hereinafter, the direction in which the index module 10 and the treating module 20 are arranged is defined as a first direction X, when viewed from the front, a direction perpendicular to the first direction X is defined to as a second direction Y, and a direction perpendicular to a plane including both the first direction X and the second direction Y is defined as a third direction Z.

The index module 10 transfers a substrate M from a container C in which the substrate M is accommodated to the treating module 20 that treats the substrate M. In addition, the index module 10 accommodates the substrate M on which a predetermined treatment has been completed in the treating module 20 in the container C. A longitudinal direction of the index module 10 may be formed in the second direction Y. The index module 10 may have a load port 12 and an index frame 14.

The container C in which the substrate M is accommodated is seated on the load port 12. The load port 12 may be located on the opposite side of the treating module 20 with respect to the index frame 14. A plurality of load ports 12 may be provided. The plurality of load ports 12 may be arranged in a line along the second direction Y. The number of load ports 120 may be increased or decreased according to process efficiency of the treating module 20 and a condition of foot print, and the like.

As the container C, an airtight container, such as a Front Opening Unfed Pod (FOUP) may be used. The container C may be placed on the load port 12 by a transfer means (not illustrated), such as an overhead transfer, an overhead conveyor, or an automatic guided vehicle, or an operator.

The index frame 14 provides a transport space for transporting the substrate M. The index frame 14 is provided with an index robot 120 and an index rail 124. The index robot 120 transfers the substrate M. The index robot 120 may transfer the substrate M between the index module 10 and a buffer unit 200 to be described later. The index robot 120 includes an index hand 122. The substrate M may be placed on the index hand 122. The index hand 122 may be provided to be movable forward and backward, rotatable about the third direction Z, and movable in the third direction Z. A plurality of hands 122 may be provided. The plurality of index hands 122 may be provided to be spaced apart from each other in the vertical direction. The plurality of index hands 122 may move forward and backward independently of each other.

The index rail 124 is provided within the index frame 14. A longitudinal direction of the index rail 124 is provided along the second direction Y. The index robot 120 is placed on the index rail 124, and the index robot 120 may be provided to be movable in a straight line on the index rail 124.

The controller 30 may control the substrate treating apparatus 1. The controller 30 may control components provided to the substrate treating apparatus 1. The controller 30 may include a process controller formed of a microprocessor (computer) that executes the control of the substrate treating apparatus, a user interface formed of a keyboard in which an operator performs a command input operation or the like in order to manage the substrate treating apparatus, a display for visualizing and displaying an operation situation of the substrate treating apparatus, and the like, and a storage unit storing a control program for executing the process executed in the substrate treating apparatus under the control of the process controller or a program, that is, a treatment recipe, for executing the process in each component according to various data and treatment conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The treating module 20 may include a buffer unit 200, a transfer frame 300, a liquid treating chamber 400, and a drying chamber 500. The buffer unit 200 provides a space in which the substrate M loaded to the treating module 20 and the substrate M unloaded from the treating module 20 temporarily stay. The transfer frame 300 provides a space for transferring the substrate M between the buffer unit 200, the liquid treating chamber 400, and the drying chamber 500. The liquid treating chamber 400 performs a liquid treatment process of liquid-treating the substrate M by supplying a liquid onto the substrate M. The drying chamber 500 performs a drying process of drying the substrate M for which the liquid treatment has been completed.

The buffer unit 200 may be disposed between the index frame 14 and the transfer frame 300. The buffer unit 200 may be located at one end of the transfer frame 300. A slot 220 in which the substrate M is placed is provided inside the buffer unit 200. A plurality of slots 220 may be provided. The plurality of slots 220 may be spaced apart from each other in the third direction Z.

A front face and a rear face of the buffer unit 200 are opened. The front face is a surface facing the index module 10, and the rear face is a surface facing the transfer frame 300. The index robot 120 may access the buffer unit 200 through the front face, and a transfer robot 320 to be described later may access the buffer unit 200 through the rear face.

A longitudinal direction of the transfer frame 300 may be provided in the first direction X. The liquid treating chamber 400 and the drying chamber 500 may be disposed on both sides of the transfer frame 300. The liquid treating chamber 400 and the drying chamber 500 may be disposed on the side of the transfer frame 300. The transfer frame 300 and the liquid treating chamber 400 may be disposed in the second direction Y. The transfer frame 300 and the drying chamber 500 may be disposed in the second direction Y.

According to the exemplary embodiment, the liquid treating chambers 400 may be disposed on both sides of the transfer frame 300. On one side of the transfer frame 300, the liquid treating chambers 400 may be provided in an arrangement of A×B (A and B are each 1 or a natural number greater than 1) in each of the first direction X and the third direction Z.

The transfer frame 300 includes the transport robot 320 and a transport rail 324. The transfer robot 320 transfers the substrate M. The transfer robot 320 transfers the substrate M between the buffer unit 200, the liquid treating chamber 400, and the drying chamber 500. The transfer robot 320 includes a transfer hand 322 on which the substrate M is placed. The substrate M may be placed on the transfer hand 322. The transfer hand 322 may be provided to be movable forward and backward, rotatable about the third direction Z, and movable along the third direction Z. A plurality of hands 322 are provided while being vertically spaced apart from each other, and the hands 322 may move forward and backward independently of each other.

The transfer rail 324 may be provided inside the transfer frame 300 along the longitudinal direction of the transfer frame 300. For example, the longitudinal direction of the transfer rail 324 may be provided in the first direction X. The transfer robot 320 may be placed on the transfer rail 324, and the transfer robot 320 may be provided to be movable on the transfer rail 324.

Figure 3:
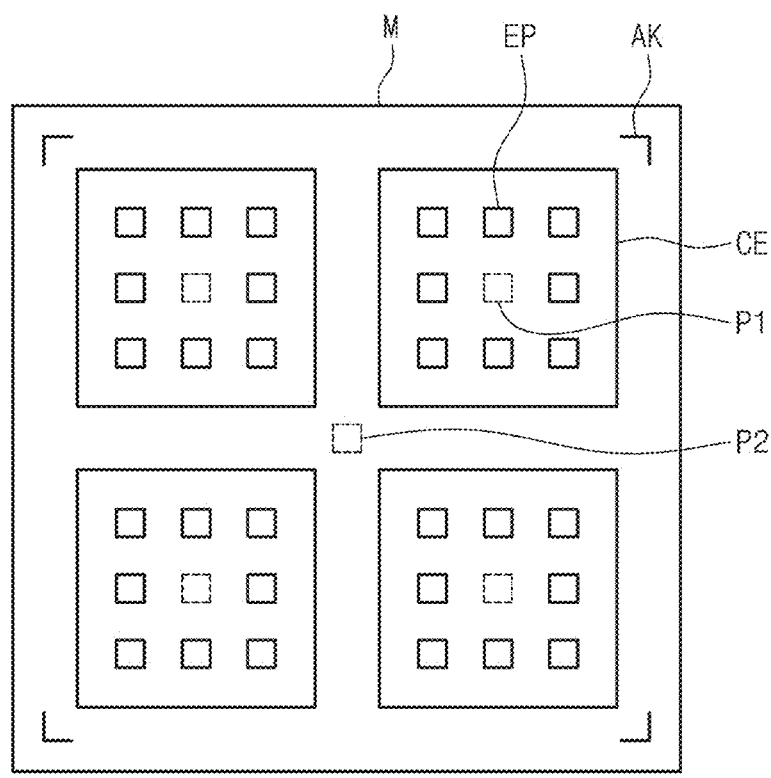
FIG. 3 is a diagram schematically illustrating a top view of a substrate treated in a liquid treating chamber of FIG. 2.

FIG. 3 is a diagram schematically illustrating the substrate treated in the liquid treating chamber of FIG. 2 viewed from the top. Hereinafter, the substrate M treated in the liquid treating chamber 400 according to the exemplary embodiment of the present invention will be described in detail with reference to FIG. 3.

Referring to FIG. 3, an object to be treated in the liquid treating chamber 400 may be a substrate of any one of a wafer, a glass, and a photomask. For example, the substrate M treated in the liquid treating chamber 400 according to the exemplary embodiment of the present invention may be a photo mask that is a 'frame' used in the exposure process.

The substrate M may have a quadrangular shape. The substrate M may be a photomask that is a 'frame' used in the exposure process. A reference mark AK, a first pattern P1, and a second pattern P2 may be formed on the substrate M.

At least one reference mark AK may be formed on the substrate M. For example, a plurality of reference marks AK may be formed in each edge region of the substrate M. The reference mark AK may be a mark used for aligning the substrate M called an align key. In addition, the reference mark AK may be a mark used to derive position information of the substrate M. For example, a photographing unit 4550 to be described later may acquire an image by photographing the reference mark AK, and transmit the acquired image to the controller 30. The controller 30 may analyze the image including the reference mark AK to detect the exact position of the substrate M. Also, the reference mark AK may be used to determine the position of the substrate M when the substrate M is transferred.

A cell CE may be formed on the substrate M. At least one cell CE may be formed. For example, a plurality of cells CE may be formed. A plurality of patterns may be formed in each of the plurality of cells CE. The patterns formed in each cell CE may be defined as one pattern group. The patterns formed in each cell CE may include an exposure pattern EP and a first pattern P1.

The exposure pattern EP may be used to form an actual pattern on the substrate M. The first pattern P1 may be a pattern representative of the exposure patterns EP formed in one cell CE. When the cell CE is provided in plurality, the first pattern P1 may be provided in plurality. For example, each of the plurality of cells CE may be provided with the first pattern P1. However, the present invention is not limited thereto, and a plurality of first patterns P1 may be formed in one cell CE. The first pattern P1 may have a shape in which portions of the respective exposure patterns EP are combined. The first pattern P1 may be referred to as a monitoring pattern. An average value of the critical dimensions of the plurality of first patterns P1 may be referred to as a Critical Dimension Monitoring Macro (CDMM).

When an operator inspects the first pattern P1 formed in any one cell CE through a Scanning Electron Microscope (SEM), whether the shape of the exposure patterns EP formed in any one cell CE is satisfactory may be estimated. Accordingly, the first pattern P1 may function as a pattern for inspection. Unlike the above-described example, the first pattern P1 may be any one of the exposure patterns EP participating in the actual exposure process. Optionally, the first pattern P1 may be a pattern for inspection and an exposure pattern participating in the actual exposure at the same time.

The second pattern P2 may be formed outside the cells CE formed on the substrate M. For example, the second pattern P2 may be located outside the region in which the plurality of cells CE is provided. The second pattern P2 may be a pattern representative of the exposure patterns EP formed on the entire substrate M. At least one second pattern P2 may be provided. For example, a plurality of second patterns P2 may be provided. The plurality of second patterns P2 may be arranged in series and/or in parallel. Optionally, the second pattern P2 may have a shape in which portions of the respective first patterns P1 are combined.

When the operator inspects the second pattern P2 through the SEM, whether the shape of the exposure patterns EP formed on one substrate M is satisfactory may be estimated.

Accordingly, the second pattern P2 may function as a pattern for inspection. The second pattern P2 may be a pattern for inspection that does not participate in the actual exposure process. The second pattern P2 may be a pattern for setting process conditions of an exposure apparatus. The second pattern P2 may be referred to as an anchor pattern.

Hereinafter, the liquid treating chamber 400 according to the exemplary embodiment of the present invention will be described in detail. In addition, hereinafter, the present invention will be described based on an example in which the treatment performed in the liquid treating chamber 400 is a Fine Critical Dimension Correction (FCC) in the process of manufacturing the mask for the exposure process.

The substrate M loaded into and treated in the liquid treating chamber 400 may be the substrate M on which a pre-treatment has been performed. Critical dimensions of the first pattern P1 and the second pattern P2 of the substrate M loaded into the liquid treating chamber 400 may be different from each other. According to the exemplary embodiment, the critical dimension of the first pattern P1 may be relatively larger than the critical dimension of the second pattern P2. For example, the critical dimension of the first pattern P1 may have a first width (for example, 69 nm), and the critical dimension of the second pattern P2 may have a second width (for example, 68.5 nm).

Figure 4:
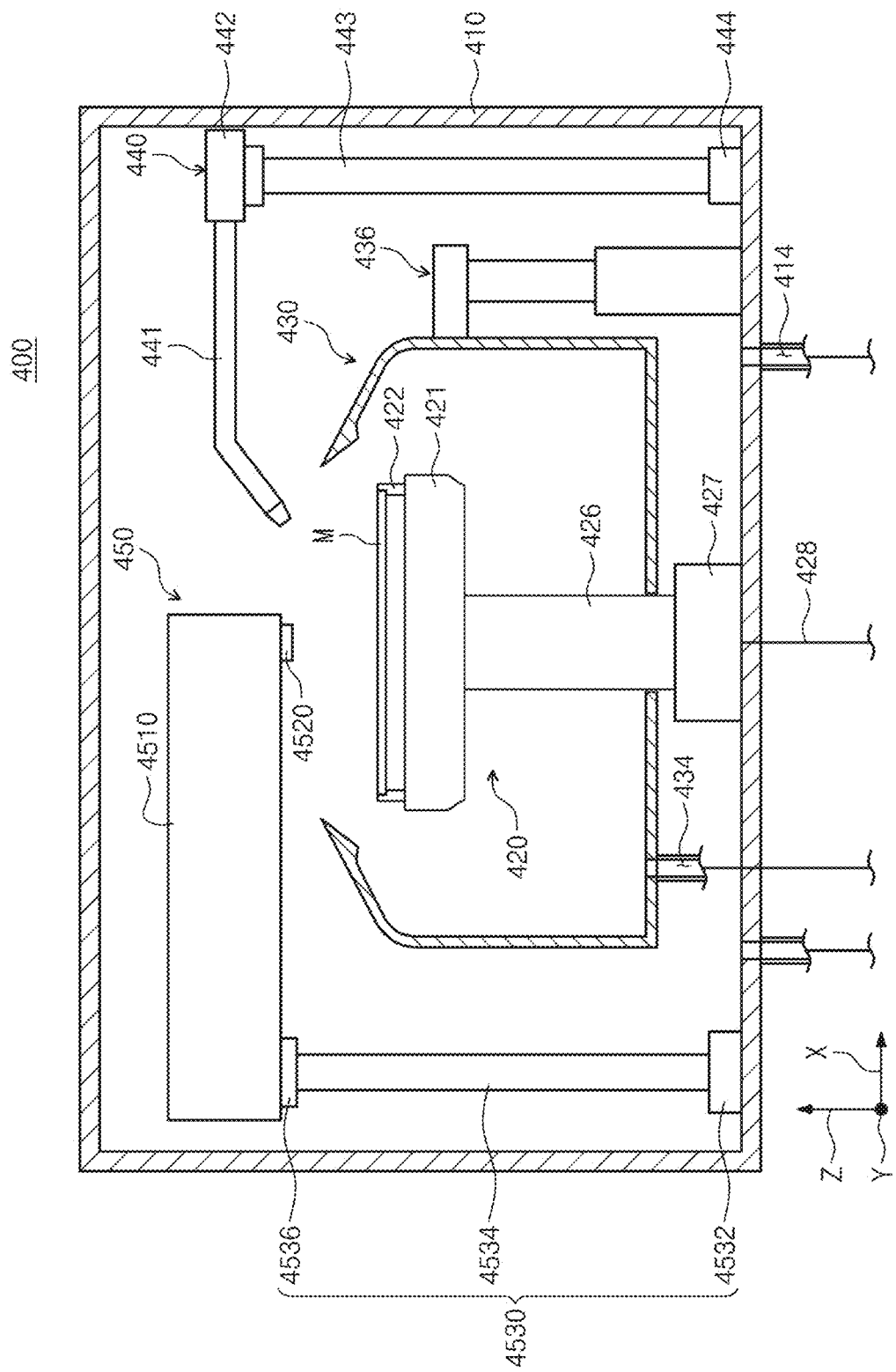
FIG. 4 is a diagram schematically illustrating an exemplary embodiment of the liquid treating chamber of FIG. 2.
Figure 5:
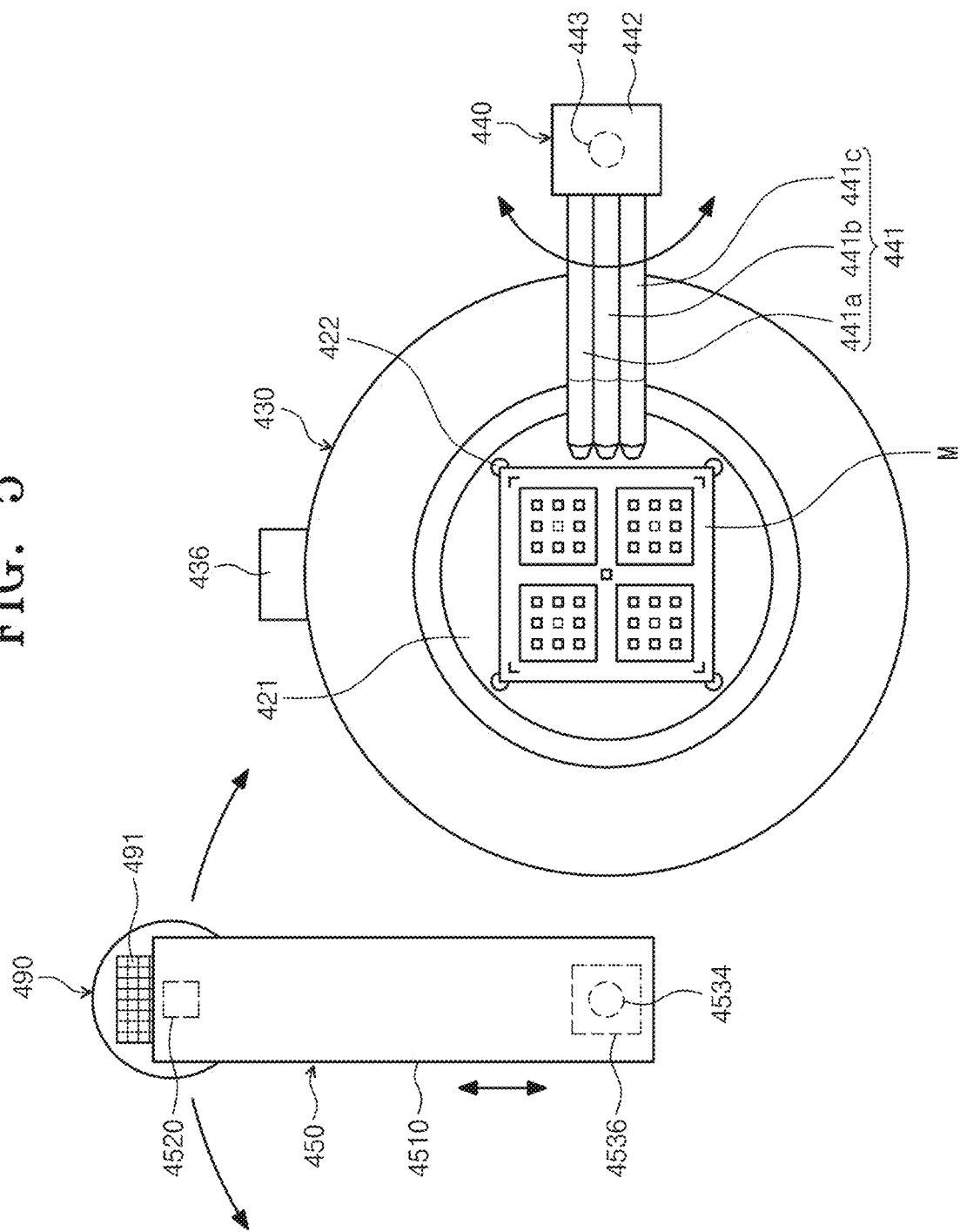
FIG. 5 is a view of the liquid treating chamber of FIG. 4 viewed from the top.

FIG. 4 is a diagram schematically illustrating an exemplary embodiment of the liquid treating chamber of FIG. 2. FIG. 5 is a diagram of the liquid treating chamber of FIG. 4 viewed from the top. Referring to FIGS. 4 and 5, the liquid treating chamber 400 includes a housing 410, a support unit 420, a treating container 430, a liquid supply unit 440, an irradiating module 450, and a home port 490.

The housing 410 has a space therein. The support unit 420, the treating container 430, the liquid supply unit 440, the irradiating module 450, and the home port 490 may be provided in the inner space of the housing 410. The housing 410 may be provided with an entrance (not illustrated) through which the substrate M can be loaded carried in and out. An inner wall surface of the housing 410 may be coated with a material having high corrosion resistance to chemicals supplied by the liquid supply unit 440.

An exhaust hole 414 may be formed in a bottom surface of the housing 410. The exhaust hole 414 may be connected to an exhaust member (not illustrated), such as a pump, capable of exhausting the atmosphere of the inner space of the housing 410. Fume that may be generated in the inner space of the housing 410 may be exhausted to the outside of the housing 410 through the exhaust hole 414.

The support unit 420 supports the substrate M. The support unit 420 may support the substrate M in the treatment space provided by the treatment container 430 to be described later. The support unit 420 rotates the substrate M. The support unit 420 may include a body 421, a support pin 422, a support shaft 426, and a driving member 427.

The body 421 may be provided in a plate shape. The body 421 may have a plate shape having a predetermined thickness. When viewed from the top, the body 421 may have an upper surface provided in a generally circular shape. The upper surface of the body 421 may have a relatively larger area than the substrate M. The support pin 422 may be coupled to the body 421.

The support pins 422 support the substrate M. The support pin 422 may have a generally circular shape when viewed from the top. When viewed from the top, the support pin 422 may have a shape in which a portion corresponding to the corner region of the substrate M is recessed downward. The support pin 422 may have a first surface and a second surface. For example, the first surface may support the lower portion of the edge region of the substrate M. The second surface may face the side of the edge region of the substrate M. Accordingly, when the substrate M is rotated, the movement of the substrate M in the lateral direction may be restricted by the second surface.

At least one support pin 422 is provided. For example, a plurality of support pins 422 may be provided. The support pins 422 may be provided in a number corresponding to the number of edge regions of the substrate M having a quadrangular shape. The support pin 422 may support the substrate M so that the lower surface of the substrate M and the upper surface of the body 421 are spaced apart from each other.

The support shaft 426 is coupled to the body 421. The support shaft 426 is located below the body 421. The support shaft 426 may be a hollow shaft. A fluid supply line 428 may be formed inside the hollow shaft. The fluid supply line 428 may supply a treatment fluid and/or treatment gas to a lower portion of the substrate M. For example, the treatment fluid may include a chemical or rinse solution. The chemical may be a liquid having acid or basic properties. The rinse solution may be pure water. For example, the treatment gas may be inert gas. The treatment gas may dry the lower portion of the substrate M. However, unlike the above-described example, the fluid supply line 428 may not be provided inside the support shaft 426.

The support shaft 426 may be rotated by the driving member 427. The driving member 427 may be a hollow motor. When the driving member 427 rotates the support shaft 426, the body 421 coupled to the support shaft 426 may rotate. The substrate M may be rotated with the rotation of the body 421 through the support pin 422.

The treatment container 430 has a treatment space. The treatment container 430 has a treatment space in which the substrate M is treated. According to the example, the treatment container 430 may have a treatment space with an open top. The treatment container 430 may have a cylindrical shape with an open top. The substrate M may be subjected to liquid treatment and heat treatment in the treatment space. The treatment container 430 may prevent the treatment liquid supplied to the substrate M from scattering to the housing 410, the liquid supply unit 440, and the irradiating module 450.

An opening into which the support shaft 426 is inserted may be formed in the bottom surface of the treatment container 430 when viewed from the top. A discharge hole 434 through which the treatment liquid supplied by the liquid supply unit 440 may be discharged to the outside may be formed in the bottom surface of the treatment container 430. The treatment liquid discharged through the discharge hole 434 may be reused through an external treatment liquid regeneration system (not illustrated). The side surface of the treatment container 430 may extend upwardly in the third direction Z from the bottom surface. The upper end of the treatment container 430 may be inclined. For example, the upper end of the treatment container 430 may extend upwardly inclined with respect to the ground as it goes toward the substrate M supported by the support unit 420.

The treatment container 430 is coupled to the lifting member 436. The lifting member 436 may move the treatment container 430 in the third direction Z. The lifting member 436 may be a driving device that moves the treating container 430 in the vertical direction. The lifting member 436 may move the treatment container 430 in the upper direction while the liquid treatment and/or heating treatment is performed on the substrate M. The lifting member 436 may move the treatment container 430 the down direction when the substrate M is loaded into the inner space 412 and when the substrate M is unloaded from the inner space 412.

The liquid supply unit 440 may supply a liquid onto the substrate M. The liquid supply unit 440 may supply a treatment liquid for liquid-treating the substrate M. The liquid supply unit 440 may supply the treatment liquid to the substrate M supported by the support unit 420. For example, the liquid supply unit 440 may supply the treatment liquid to the substrate M on which the first pattern P1 formed in the plurality of cells CE and the second pattern P2 formed outside the region where the cells CE are formed.

The treatment liquid may be provided as an etching solution or a rinse solution. The etching solution may be a chemical. The etching solution may etch the pattern formed on the substrate M. The etching solution may be referred to as an etchant. The etchant may be a liquid containing hydrogen peroxide and a mixture in which ammonia, water, and an additive are mixed. The rinse solution may clean the substrate M. The rinse solution may be provided as a known chemical liquid.

The liquid supply unit 440 may include a nozzle 441, a fixed body 442, a rotation shaft 443, and a rotation member 444. The nozzle 441 may supply the treatment liquid to the substrate M supported by the support unit 420. One end of the nozzle 441 may be connected to the fixed body 442, and the other end of the nozzle 441 may extend from the fixed body 442 toward the substrate M. The nozzle 441 may extend from the fixed body 442 in the first direction X. The other end of the nozzle 441 may be bent and extended at a predetermined angle in a direction toward the substrate M supported by the support unit 420.

The nozzle 441 may include a first nozzle 441a, a second nozzle 441b, and a third nozzle 441c. Any one of the first nozzle 441a, the second nozzle 441b, and the third nozzle 441c may supply a chemical among the above-described treatment liquids. Further, another one of the first nozzle 441a, the second nozzle 441b, and the third nozzle 441c may supply a rinse solution among the above-described treatment liquids. Another one of the first nozzle 441a, the second nozzle 441b, and the third nozzle 441c may supply different types of chemicals from those supplied by any one of the first nozzle 441a, the second nozzle 441b, and the third nozzle 441c.

The fixed body 442 may fix and support the nozzle 441. The fixed body 442 may be connected to the rotation shaft 443 rotated based on the third direction Z by the rotation member 444. When the rotation member 444 rotates the rotation shaft 443, the fixed body 442 may be rotated about the third direction Z. Accordingly, a discharge port of the nozzle 441 may be moved between a liquid supply position, which is a position where the treatment liquid is supplied to the substrate M, and a standby position, which is a position where the treatment liquid is not supplied to the substrate M.

Figure 6:
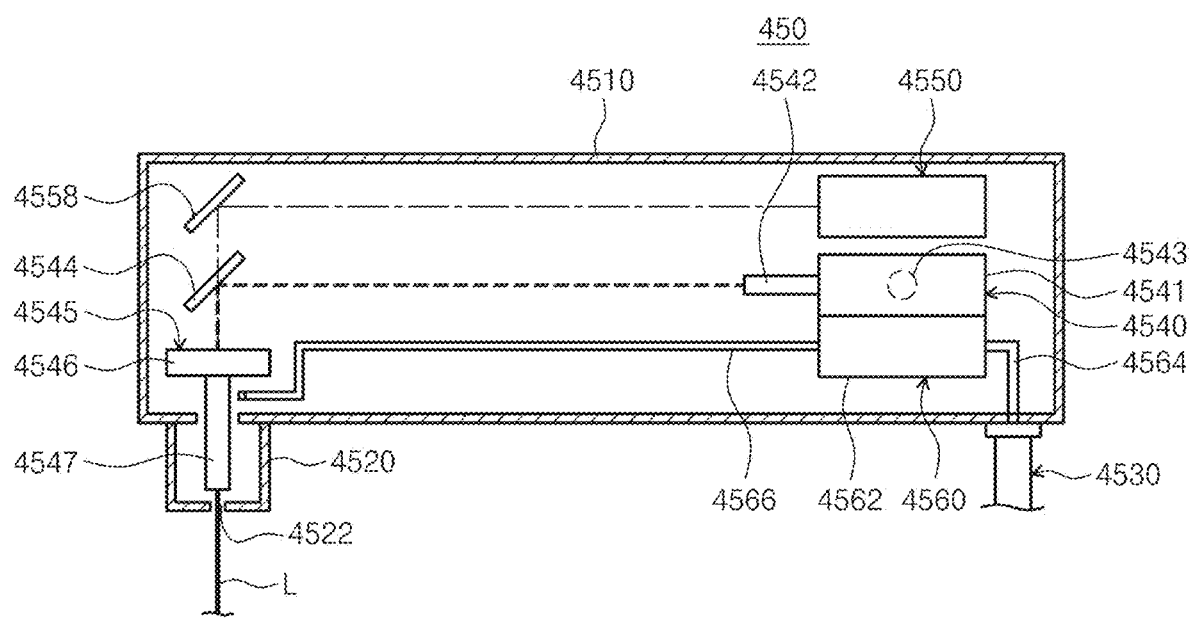
FIG. 6 is a diagram schematically illustrating an irradiating module according to the exemplary embodiment of FIG. 4 viewed from the front.
Figure 7:
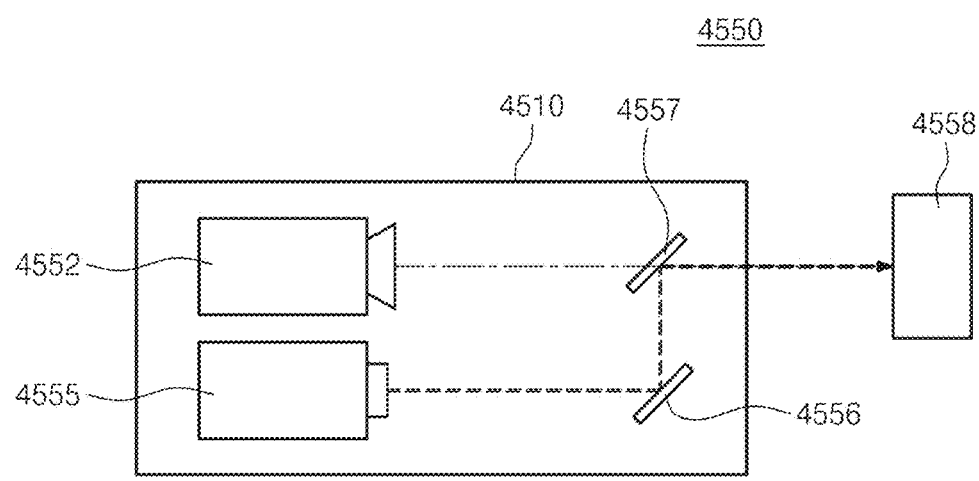
FIG. 7 is a diagram schematically illustrating the irradiating module of FIG. 6 viewed from the top.

Hereinafter, the irradiating module according to the exemplary embodiment of the present invention will be described in detail. FIG. 6 is a diagram schematically illustrating the irradiating module according to the exemplary embodiment of FIG. 4 viewed from the front. FIG. 7 is a diagram schematically illustrating the irradiating module of FIG. 6 viewed from the top.

Referring to FIGS. 4 to 7, the irradiating module 450 may perform a heat treatment on the substrate M. The irradiating module 450 may heat the substrate M to which the treatment liquid is supplied. The irradiating module 450 may heat the substrate M to which the treatment liquid is supplied by irradiating light to the substrate M. For example, the irradiating module 450 may heat a specific area of the substrate M by irradiating laser light to the substrate M on which the liquid film is formed, after the liquid is supplied onto the substrate M by the liquid supply unit 440.

The irradiating module 450 may include a housing 4510, a cover 4520, a moving unit 4530, a laser unit 4540, the photographing unit 4550, and a cooling unit 4560.

The housing 4510 has an accommodation space therein. The laser unit 4540, the photographing unit 4550, and the cooling unit 4560 may be located in the accommodation space of the housing 4510. For example, the laser unit 4540, a camera unit 4552, a lighting unit 4554, and a cooling unit 4560 may be positioned in the accommodation space of the housing 4510. The housing 4510 protects the laser unit 4540, the photographing unit 4550, and the cooling unit 4560 located in the accommodation space from particles, fumes, or scattering liquids generated during the process.

A through hole may be formed in a lower portion of the housing 4510. An irradiation end 4545 to be described later may be inserted into the through hole of the housing 4510. As the irradiation end 4545 is inserted into the through hole of the housing 4510, one end of the irradiation end 4545 may protrude from the lower end of the housing 4510.

A cover 4520 to be described later may be coupled to a lower portion of the housing 4510. When viewed from the top, the center of the cover 4520 coupled to the lower portion of the housing 4510 may coincide with the center of the through hole of the housing 4510. Accordingly, one protruding end of the irradiation end 4545 may be located in the inner space of the cover 4520 to be described later.

The cover 4520 is located at the lower end of the housing 4510. When viewed from the top, the cover 4520 may be formed to protrude downward from the lower end of the housing 4510 at a position corresponding to the irradiation end 4545 to be described later. The cover 4520 may have a substantially cylindrical shape. The cover 4520 has an inner space. The inner space of the cover 4520 may be located at one end of the irradiation end 454. For example, a portion of a barrel 4537 may be positioned in the inner space of the cover 4520. The cover 4520 may be integrally formed with the housing 4510. However, the present invention is not limited thereto, and the housing 4510 and the cover 4520 may be separately formed, and may be coupled physically or chemically.

An opening 4522 is formed in the bottom surface of the cover 4520. The opening 4522 is formed at a position corresponding to the laser light L irradiated from the irradiation end 4545, which will be described later, when viewed from the top. In addition, the opening 4522 has a diameter that does not interfere with the laser light L irradiated from the irradiation end 4545, image capturing by the camera unit 4552 to be described later, and light from the lighting unit 4554 to be described later.

The moving unit 4530 moves the housing 4510. The moving unit 4530 may move the irradiation end 4545 to be described later by moving the housing 4510. The moving unit 4530 may include a driver 4532, a shaft 4534, and a moving member 4536.

The driver 4532 may be a motor. The driver 4532 may be connected to the shaft 4534. The driver 4532 may move the shaft 4534 in the vertical direction. The driver 4532 may rotate the shaft 4534. For example, a plurality of drivers 4532 may be provided. Any one of the plurality of drivers 4532 may be provided as a rotation motor for rotating the shaft 4534, and the other of the plurality of drivers 4532 may be provided as a linear motor for moving the shaft 4534 in the vertical direction.

The haft 4534 may be provided as a hollow rod. A supply flow path 4564 to be described later may be located in the inner space of the shaft 4534. The shaft 4534 may be connected to the housing 4510. The shaft 4534 may be connected to the housing 4510 via the moving member 4536 to be described later. As the shaft 4534 rotates, the housing 4510 may also rotate. Accordingly, the position of the irradiation end 4545, which will be described later, may also be changed. For example, the position of the irradiation end 4545 may be changed in the third direction Z. In addition, the position of the irradiation end 4545 may be changed in the third direction Z as a rotation axis.

When viewed from the top, the center of the irradiation end 4545 may move in an arc to the center of the shaft 4534. When viewed from the top, the center of the irradiation end 4545 may be moved to pass through the center of the substrate M supported by the support unit 420. The irradiation end 4545 be moved between an irradiation position in which the laser light L is irradiated to the substrate M and a standby position in which the substrate M waits without performing heat treatment by the moving unit 4530.

According to the example, the irradiation position may be an upper portion of the second pattern P2 formed on the substrate M supported by the support unit 420. The irradiation position may be a position corresponding to the region in which the second pattern P2 formed on the substrate M is formed when viewed from the top. The home port 490 to be described later is located in the standby position.

The moving member 4536 may be provided between the housing 4510 and the shaft 4534. According to the exemplary embodiment, the moving member 4536 may be an LM guide. The moving member 4536 may move the housing 4510 in the lateral direction. The moving member 4536 may move the housing 4510 in the first direction X and/or the second direction Y. The position of the irradiation end 4545 may be variously changed by the driver 4532 and the moving member 4536.

The laser unit 4540 may heat-treat the substrate M. The laser unit 4540 may heat the substrate M. The laser unit 4540 may heat a partial region of the substrate M. The laser unit 4540 may heat a specific area of the substrate M. The laser unit 4540 may be supplied with a chemical to heat the substrate M on which the liquid film is formed. In addition, the laser unit 4540 may heat the pattern formed on the substrate M. The laser unit 4540 may heat any one of the first pattern P1 and the second pattern P2. The laser unit 4540 may heat the second pattern P2 between the first pattern P1 and the second pattern P2. According to the exemplary embodiment, the laser unit 4530 may heat the second pattern P2 by irradiating the laser light L.

The laser unit 4540 may include a laser irradiator 4541, a beam expander 4542, a tilting member 4543, a lower reflective member 4544, and a lens member 4545. The laser irradiator 4541 irradiates the laser light L. The laser irradiator 4541 may irradiate the laser light L having straightness. The laser light L irradiated from the laser irradiator 4541 may be irradiated onto the substrate M through the lower reflective member 4544 and the lens member 4545, which will be described later, in turn. For example, the laser light L irradiated from the laser irradiator 4541 may be irradiated to the second pattern P2 formed on the substrate M through the lower reflective member 4544 and the lens member 4545 in turn.

The beam expander 4542 may adjust the characteristics of the laser light L irradiated from the laser irradiation unit 4541. The beam expander 4542 may adjust the profile of the laser light L irradiated from the laser irradiation unit 4541. For example, the beam expander 4542 may change the shape of the laser light L irradiated from the laser irradiation unit 4541. Further, the beam expander 4542 may increase or reduce the diameter of the laser light L irradiated from the laser irradiation unit 4541.

The tilting member 4543 may tilt the irradiation direction of the laser light L irradiated by a laser irradiator 4541. The tilting member 4543 may rotate the laser irradiator 4541 about one axis. The tilting member 4543 may tilt the irradiation direction of the laser light L irradiated from the laser irradiator 4541 by rotating the laser irradiator 4541. The tilting member 4543 may include a motor.

The lower reflective member 4544 may change the irradiation direction of the laser light L irradiated from the laser irradiator 4541. For example, the lower reflective member 4544 may change the irradiation direction of the laser light L irradiated in the horizontal direction to the vertical downward direction. For example, the lower reflective member 4544 may change the irradiation direction of the laser light L to a direction toward the irradiation end 4545, which will be described later. The laser light L of which the irradiation direction is changed by the lower reflective member 4544 travels to the target substrate M or a detection member 491 provided in the home port 490 through the irradiation end 4545 to be described later.

When viewed from the top, the lower reflective member 4544 may be positioned to overlap the upper reflective member 4558 to be described later. The lower reflective member 4544 may be disposed below the upper reflective member 4558. The lower reflective member 4544 may be tilted at the same angle as that of the upper reflective member 4558.

The lens member 4545 may include a lens 4546 and a barrel 4547. According to the example, the lens 4546 may be provided as an objective lens. The barrel 4547 may be installed at the lower end of the lens 4546. The barrel 4547 may have a generally cylindrical shape. According to an example, the lens 4546 may be provided as an objective lens. The barrel 4547 may be installed at the lower end of the lens 4546. The barrel 4547 may have a generally cylindrical shape. The barrel 4547 may be inserted into a through hole formed at the lower end of the housing 4510. One end of the barrel 4547 may be positioned to protrude from the lower end of the housing 4510. A portion of the barrel 4547 protruding from the lower end of the housing 4510 may be located in the accommodation space of the cover 4520.

The lens member 4545 may function as the irradiation end 4545 through which the laser light L is irradiated to the substrate M. The laser light L irradiated from the laser irradiator 4541 may be irradiated to the substrate M through the irradiation end 4545 through the lower reflective member 4544. In addition, image photographing by the camera unit 4552, which will be described later, may be performed through the irradiation end 4545. In addition, the light irradiated by the lighting unit 4554, which will be described later, may be formed through the irradiation end 4545.

The imaging unit 4550 may photograph the laser light L irradiated from the laser unit 4540. The photographing unit 4550 may acquire an image, such as an image and/or a photo, of an area to which the laser light L is irradiated. The photographing unit 4550 may monitor the laser light L irradiated from the laser irradiator 4541. For example, the photographing unit 4550 may acquire an image, such as an image and/or a photo, of the laser light L irradiated onto the substrate M, and transmit data for the acquired image to the controller 30. Also, the photographing unit 4550 may acquire an image, such as an image and/or a photo, of the laser light L irradiated to the detection member 491 to be described later, and transmit data for the acquired image to the controller 30.

The photographing unit 4550 may include the camera unit 4552, the lighting unit 4554, and the upper reflective member 4558.

The camera unit 4552 acquires an image of the laser light L irradiated from the laser irradiator 4541. For example, the camera unit 4552 may acquire an image including a point to which the laser light L irradiated from the laser irradiator 4541 is irradiated. Further, the camera unit 4552 acquires an image of the substrate M supported by the support unit 420. Further, the camera unit 4552 may acquire an image of the detection member 491 to be described later. The camera unit 4552 may be a camera. The camera unit 4552 may photograph an image in a direction toward the upper reflective member 4558, which will be described later. The photo and/or image acquired by the camera unit 4552 may be transmitted to the controller 30.

The lighting unit 4554 provides light so that the camera unit 4552 is capable of easily acquiring an image. The lighting unit 4554 may include a lighting member 4555, a first reflective plate 4556, and a second reflective plate 4557.

The lighting member 4555 irradiates light. The lighting member 4555 provides light. The light provided by the lighting member 4555 may be sequentially reflected along the first reflective plate 4556 and the second reflective plate 4557. The lighting member 4555 irradiates light toward the first reflective plate 4556. The light reflected from the first reflective plate 4556 travels toward the second reflective plate 4557. The light reflected from the second reflective plate 4557 may travel in a direction toward the upper reflecting member 4558 to be described later.

The upper reflective member 4558 may change the photographing direction of the camera unit 4552. The upper reflective member 4558 may change the photographing direction of the camera unit 4552, which is the horizontal direction, to the vertical downward direction. For example, the upper reflective member 4558 may change the photographing direction of the camera unit 4552 to face the irradiation end 4545.

The upper reflective member 4558 may change the light irradiated from the lighting member 4555 to pass through the first reflective plate 4556 and the second reflective plate 4557 sequentially and head the irradiation end 4545.

The upper reflective member 4558 and the lower reflective member 4544 may be positioned to overlap each other when viewed from the top. The upper reflective member 4558 may be disposed above the lower reflective member 4544. The upper reflective member 4558 and the lower reflective member 4544 may be tilted at the same angle.

When viewed from the top, the upper reflective member 4558 and the lower reflective member 4544 may be provided so that the irradiation direction of the laser light L irradiated by the laser irradiator 4541, the imaging direction in which the camera unit 4552 acquires the image, and the irradiation direction of the light provided by the lighting unit 4554 are coaxial.

The cooling unit 4560 is located within the housing 4510. The cooling unit 4560 is located in the accommodation space of the housing 4510. The cooling unit 4560 may exchange heat with the laser unit 4540. For example, the cooling unit 4560 may cool the laser unit 4540. The cooling unit 4560 may include a plate 4562, a supply flow path 4564, and a discharge flow path 4566.

The plate 4562 may be coupled to the lower portion of the laser unit 4540. An upper end of the plate 4562 and the lower end of the laser irradiator 4541 may be in surface contact with each other. According to the example, the plate 4562 may be provided as a heat sink having a flow path (not illustrated) therein. A cooling fluid flows in a flow path (not illustrated) formed inside the plate 4562. The cooling fluid is supplied from a cooling fluid supply source (not illustrated). The cooling fluid supply source (not illustrated) serves as a source for storing and/or supplying a cooling fluid. The cooling fluid may be supplied from the cooling fluid supply source (not illustrated) and flow to the flow path (not illustrated) formed in the plate 4562 through the supply flow path 4564 to be described later. The cooling fluid may be provided as inert gas. However, the present invention is not limited thereto, and the cooling fluid may be provided as cooling water. Hereinafter, for convenience of description, the present invention will be described based on the case in which cooling gas is provided as a cooling fluid as an example.

The cooling gas flowing in the flow path (not illustrated) formed inside the plate 4562 may absorb heat generated by the laser unit 4540. Accordingly, the cooling gas may perform heat exchange with the laser unit 4540 to cool the laser unit 4540.

The supply flow path 4564 may supply cooling gas to the flow path (not illustrated) formed inside the plate 4562. The supply flow path 4564 may be connected to the flow path (not illustrated) formed inside the plate 4562 and the cooling fluid supply source (not illustrated). One end of the supply flow path 4564 may be connected to one end of the flow path (not illustrated) of the plate 4562 inside the housing 4510. The other end of the supply flow path 4564 may be connected to a cooling fluid supply source (not illustrated) located outside the housing 4510. The supply flow path 4564 may extend into the hollow shaft 4534 through the bottom surface of the housing 4510.

The discharge flow path 4566 provides a path for discharging the cooling gas that has passed through the flow path (not illustrated) formed inside the plate 4562. The discharge flow path 4566 may be located in the accommodation space of the housing 4510. One end of the discharge flow path 4566 may be connected to the other end of the flow path (not illustrated) formed inside the plate 4562. The other end of the discharge flow path 4566 may be located in an area adjacent to the through hole formed at the lower end of the housing 4510. The other end of the discharge flow path 4566 may be positioned between the outer surface of the irradiation end 4545 and the inner surface of the housing 4510. The other end of the discharge flow path 4566 may be located in an area adjacent to the space between the irradiation end 4545 and the through hole formed at the lower end of the housing 4510. For example, the other end of the discharge flow path 4566 may be located between the lower surface of the lens 4546 and the bottom surface of the housing 4510.

Figure 8:
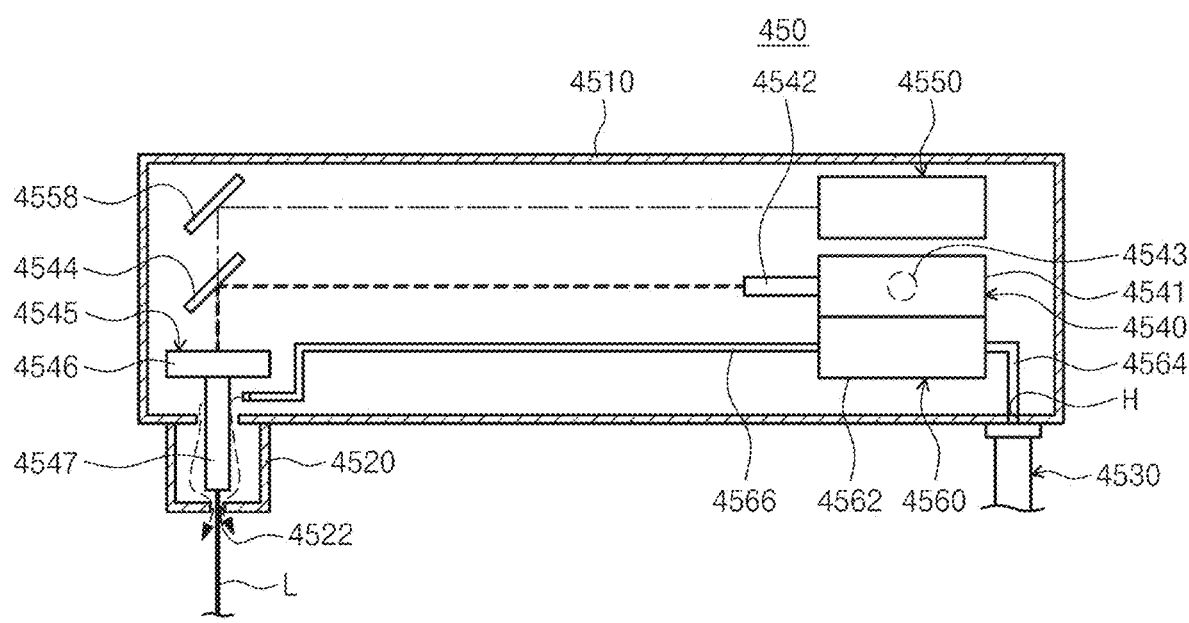
FIG. 8 is a diagram schematically illustrating a state in which a cooling fluid flows in the irradiating module of FIG. 6.

FIG. 8 is a diagram schematically illustrating a state in which the cooling fluid flows in the irradiating module of FIG. 6. Referring to FIG. 8, the cooling gas discharged from the other end of the discharge flow path 4566 may head the irradiation end 4545. The cooling gas discharged from the discharge flow path 4566 flows into the inner space of the cover 4520. The cooling gas introduced into the inner space of the cover 4520 flows into the space between the inner surface of the cover 4520 and the outer surface of the irradiation end 4545. The cooling gas is discharged to the outside of the cover 4520 through the opening 4522 through the inner space of the cover 4520.

In general, when the heat treatment process is performed on the substrate M, the distance between the substrate M and the irradiating module 450 is located very close. For example, when heat the treatment is performed on the substrate M at a position very adjacent to the substrate M, the liquid film formed on the substrate M may be attached from the substrate M to the irradiating module 450. In addition, particles, such as fume, generated from the substrate M during the process may be attached to the irradiating module 450. In particular, when the liquid and/or particles are attached to the irradiation end 4545 to which various types of light are irradiated, the path and/or profile of the laser light L irradiated from the irradiating module 450 is changed. This makes it difficult to perform a precise etching process on the substrate M.

The irradiating module 450 according to the exemplary embodiment of the present invention is provided to surround the laser unit 4540 irradiating the laser light L, the camera unit 4552 photographing an image, and the lighting unit 4554 with the housing 4510, so that it is possible to primarily protect the laser unit 4540, the camera unit 4552 that photographs an image, and the lighting unit 4554 from the liquid rebounded during the process and/or particles generated during the process.

In addition, the cover 4520 according to the exemplary embodiment of the present invention may secondarily protect the irradiation end 4545 where the laser light is irradiated, the image is photographed, and the light is irradiated from the rebounded liquid and/or particles.

In addition, the cooling unit 4560 according to the exemplary embodiment of the present invention may suppress the temperature rise of the laser unit 4540 due to the heat generated in the process of irradiating the laser light L by the laser unit 4540 through heat exchange with the laser unit 4540. At the same time, the cooling unit 4560 supplies the cooling gas used to cool the laser unit 4540 to the inner space of the cover 4520, so that it is possible to minimize the introduction of the liquid and/or particles rebounded through the opening 4522 into the inner space of the cover 4520. That is, in addition to cooling the laser unit 4540, the cooling unit 4560 according to the exemplary embodiment of the present invention prevents the inflow of process by-products and droplets rebounded from the substrate M through the opening 4522, thereby efficiently protecting the components provided to the irradiating module 450 including the irradiation end 4545.

Referring back to FIG. 5, the home port 490 is located in the inner space of the housing 410. The home port 490 may be installed in an area below the irradiation end 4545 when the irradiation end 4545 is in the standby position by the moving unit 4530. That is, the home port 490 provides a standby position where the laser unit 4540 waits.

Figure 9:
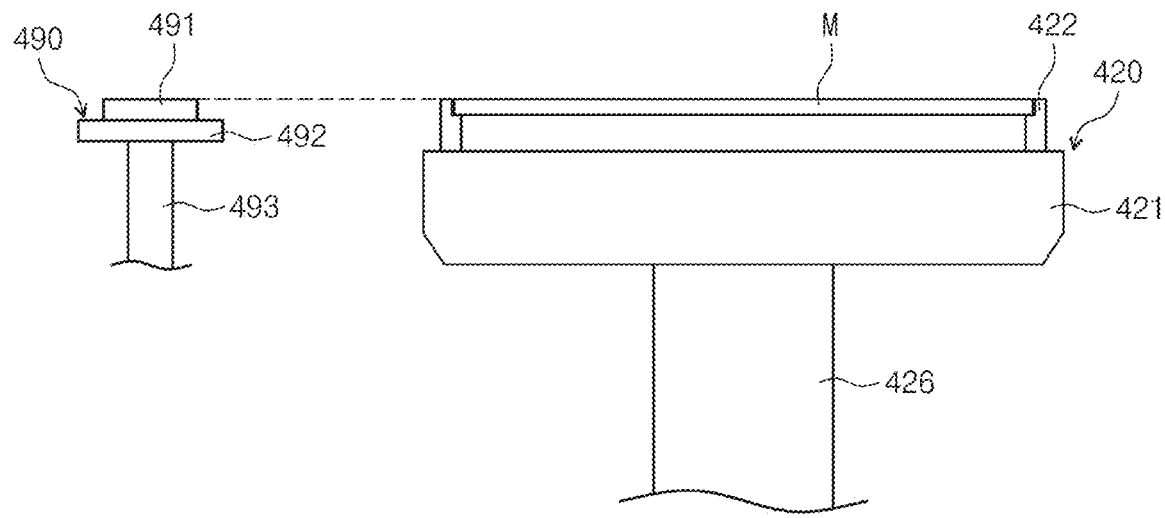
FIG. 9 is a diagram schematically illustrating an exemplary embodiment of a home port of FIG. 4.
Figure 10:
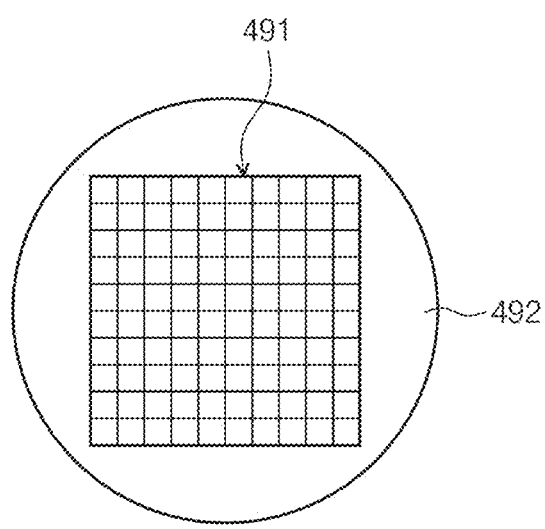
FIG. 10 is a diagram schematically illustrating the home port and a detection member of FIG. 9 viewed from the top.

FIG. 9 is a diagram schematically illustrating an exemplary embodiment of the home port of FIG. 4. FIG. 10 is a diagram schematically illustrating the home port and the detection member of FIG. 9 viewed from the top.

Referring to FIGS. 9 and 10, the home port 490 may include the detection member 491, a body 492, and a support frame 493. The detection member 491 may be located at the upper end of the body 492 to be described later. For example, the detection member 491 may be located in an area below the irradiation end 4545 when the irradiation end 4545 is in the standby position.

The detection member 491 detects the characteristics of the laser light L irradiated from the laser unit 4540. For example, the detection member 491 may detect a diameter, sharpness, circular ratio, gradient, and/or center position data of the laser light L among the characteristics of the laser light L irradiated from the laser unit 4540.

According to the exemplary embodiment, the photographing unit 4550 may transmit the photo and/or image of the detection member 491 and the laser light L irradiated to the detection member 491 to the controller 30. The controller 30 may control the beam expander 4542 or the moving unit 4530 based on the transmitted data of the laser light L to change the characteristics of the laser light L.

The detection member 491 may be defined as a global coordinate system. A preset reference position may be displayed on the detection member 491. A scale may be displayed on the detection member 491 to check an error between the reference position and the actual irradiation position where the laser light L is irradiated to the detection member 491.

The detection member 491 may be coupled to the upper surface of the body 492. The body 492 may be supported by the support frame 493. The support frame 493 may move up and down by a lifting member (not illustrated). The height of the detection member 491 determined by the body 492 and the support frame 493 may be set to the same height as that of the substrate M supported by the support unit 420. According to the exemplary embodiment, the height from the bottom surface of the housing 410 to the top surface of the detection member 491 may be the same as the height from the bottom surface of the housing 410 to the top surface of the substrate M supported by the support unit 420.

This is for the purpose of matching the height of the irradiation end 4545 when the characteristic of the laser light L is detected by using the detection member 491 and the height of the irradiation end 4545 when the substrate M is heated. In addition, when the irradiation direction of the laser light L irradiated from the irradiation end 4545 is slightly shifted with respect to the third direction Z, depending on the height of the irradiation end 4545, the irradiation position of the laser light L may vary, so that the detection member 491 may be provided at the same height as that of the substrate M supported by the support unit 420.

Hereinafter, an irradiating module according to another exemplary embodiment of the present invention will be described. The exemplary embodiment of the irradiating module described below is provided mostly similar to the exemplary embodiments of the irradiating module described above. Accordingly, the description of the irradiating module according to the exemplary embodiment to be described below is similar to the description of the irradiating module according to the above-described exemplary embodiment except for the case of additional explanation among the descriptions of the irradiating module according to another exemplary embodiment to be described below, so that a description of overlapping content will be omitted.

Figure 11:
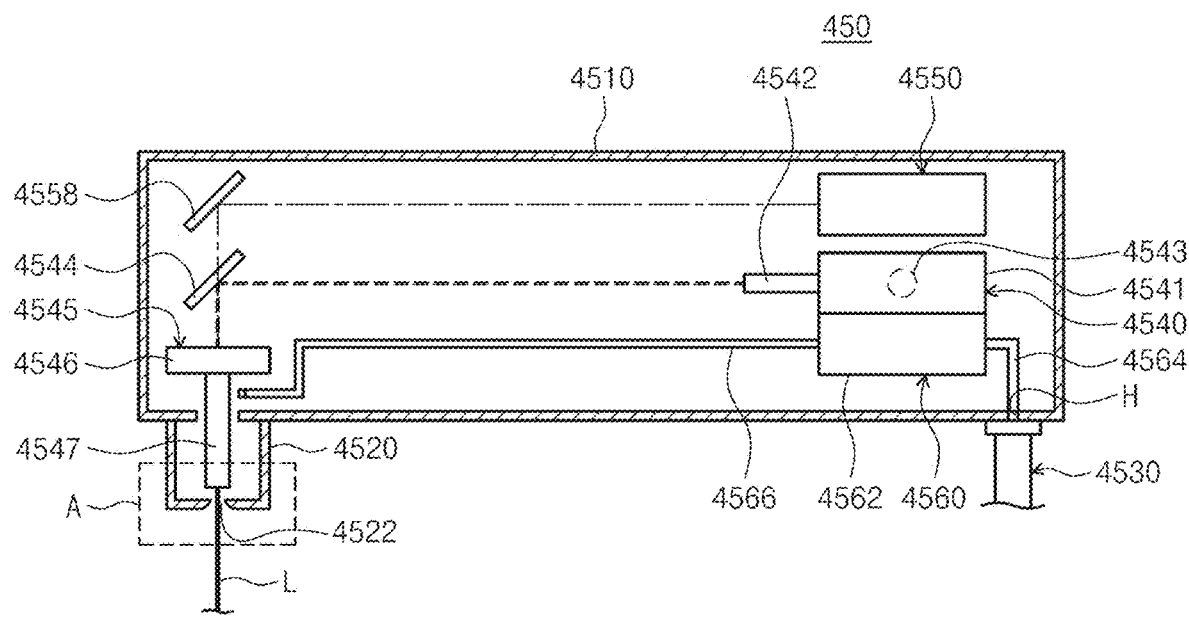
FIG. 11 is a diagram schematically illustrating an irradiating module according to another exemplary embodiment of FIG. 4 viewed from the front.

FIG. 11 is a diagram schematically illustrating an irradiating module according to another exemplary embodiment of FIG. 4 viewed from the front. Referring to FIG. 11, the opening 4522 is formed in the bottom surface of the cover 4520 according to the exemplary embodiment. The location or size of the opening 4522 is similar to that of the cover 4520 provided in the irradiating module 450 described above. A side surface of the opening 4522 may be formed to be curved. The opening 4522 may be formed to be curved from the upper end to the lower end of the bottom surface of the cover 4520. When viewed from the front, the upper end of the opening 4522 may be formed closer to the center of the opening 4522 than the lower end thereof.

Figure 12:
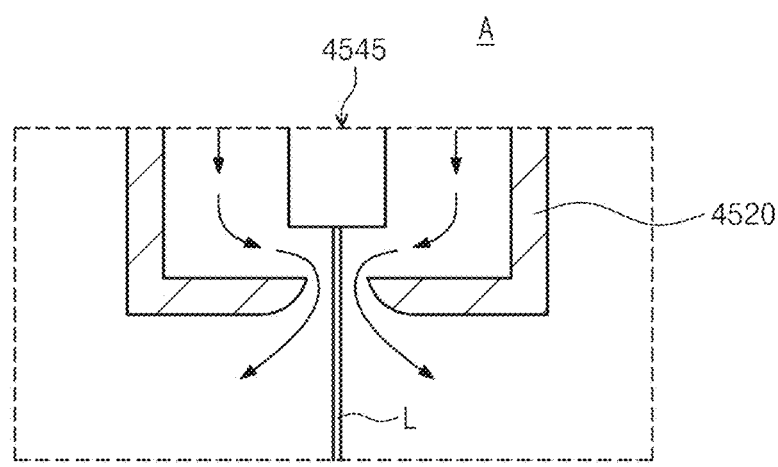
FIG. 12 is an enlarged view of a portion A of FIG. 11 schematically illustrating a state in which a cooling fluid flows in an inner space of a cover.

FIG. 12 is an enlarged view of a portion A of FIG. 11 schematically illustrating a state in which the cooling fluid flows in the inner space of the cover. Referring to FIG. 12, the cooling fluid introduced into the inner space of the cover 4520 flows toward the opening 4522. For example, the cooling fluid may be provided as cooling gas. When the cooling gas passes through the opening 4522, the cooling gas may flow along the side surface of the curved opening 4522. The cooling gas flows in a direction away from the center of the opening 4522 along the sidewall of the opening 4522 which is curved by the so-called Coanda Effect.

In general, when the laser light L is irradiated from the irradiating module 450 to the substrate M on which the liquid film is formed, the distance between the irradiation end 4545 and the substrate M is formed to be very narrow. Accordingly, the liquid discharged on the substrate M or the liquid film formed on the substrate M may be rebounded to the irradiating module 450 by the irradiated laser light L. Further, when the irradiating module 450 irradiates the laser light L to the substrate M at a distance adjacent to the substrate M, the liquid film formed on the substrate M may be damaged. This causes etch non-uniformity to the substrate M.

Accordingly, according to the exemplary embodiment of the present invention, the side surface of the opening 4522 formed at the lower end of the cover 4520 surrounding the irradiation end 4545 is formed to be curved, so that the cooling gas supplied to the inner space of the cover 4520 may exit laterally along the side surface of the opening 4522. It is possible to minimize the influence of the cooling gas flowing out from the inner space of the cover 4520 to the opening 4522 on the liquid film formed on the substrate M and/or the liquid discharged onto the substrate M. Accordingly, it is possible to protect the irradiating module 450 from the liquid rebounded from the substrate M and/or particles generated during the process while minimizing damage to the liquid film formed on the substrate M.

Figure 13:
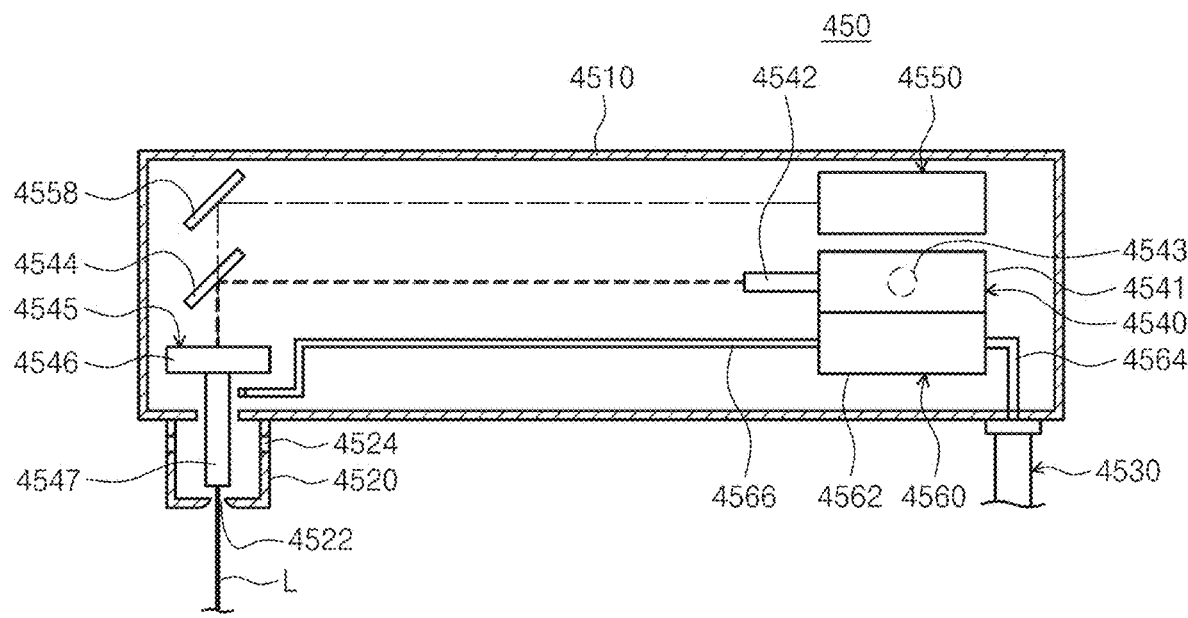
FIG. 13 is a diagram schematically illustrating an irradiating module according to another exemplary embodiment of FIG. 4 viewed from the front.
Figure 14:
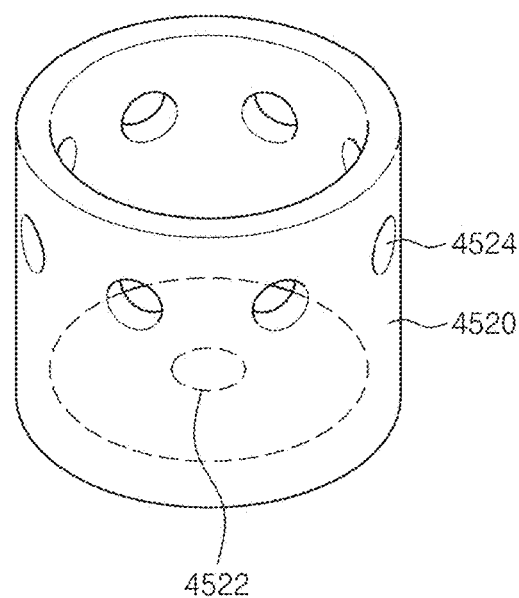
FIG. 14 is a perspective view of the cover of FIG. 13.

FIG. 13 is a diagram schematically illustrating an irradiating module according to another exemplary embodiment of FIG. 4 viewed from the front. FIG. 14 is a perspective view of the cover of FIG. 13. Referring to FIGS. 13 and 14, an opening 4522 and a side hole 4524 may be formed in the cover 4520 according to the exemplary embodiment of the present invention. The opening 4522 formed in the cover 4520 according to the exemplary embodiment of the present invention is similar to the opening 4522 described with reference to FIGS. 4 to 8 or the opening 4522 described with reference to FIGS. 11 to 12.

The side hole 4524 may be formed in a side surface of the cover 4520 according to the exemplary embodiment. The side hole 4524 may pass through the side surface of the cover 4520. At least one side hole 4524 may be formed. For example, a plurality of side holes 4524 may be formed. The plurality of side holes 4524 may be formed to be spaced apart from each other along the circumferential direction of the cover 4520 on the side surface of the cover 4520. Optionally, although not illustrated, the side holes 4524 may be formed to be spaced apart from each other along the circumferential direction of the cover 4520 and along the vertical direction of the cover 4520.

According to the exemplary embodiment of the present invention, a portion of the cooling gas supplied to the inner space of the cover 4520 may be discharged through the side hole 4524 formed in the side surface of the cover 4520. In addition, another portion of the cooling gas supplied to the inner space of the cover 4520 may be discharged through the opening 4522 formed in the bottom surface of the cover 4520. That is, the amount of cooling gas discharged through the opening 4522 may be dispersed. Accordingly, it is possible to minimize the influence of the cooling gas discharged from the inner space of the cover 4520 to the opening 4522 on the liquid film formed on the substrate M and/or the liquid discharged to the substrate M.

Figure 15:
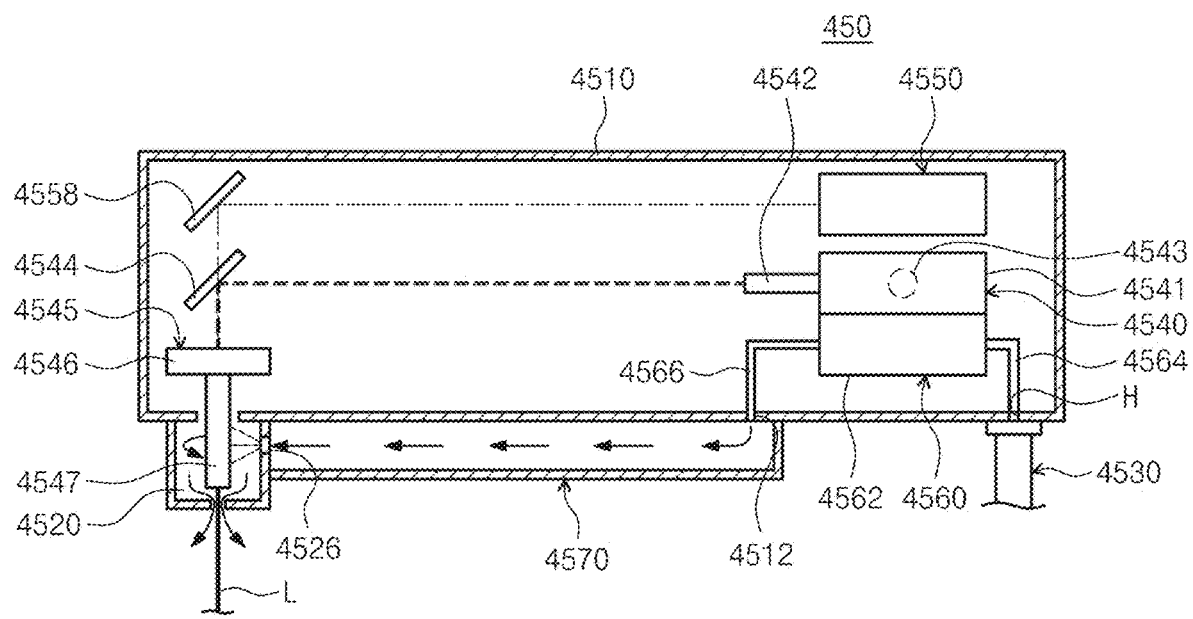
FIG. 15 is a diagram schematically illustrating an irradiating module according to another exemplary embodiment of FIG. 4 viewed from the front.
Figure 16:
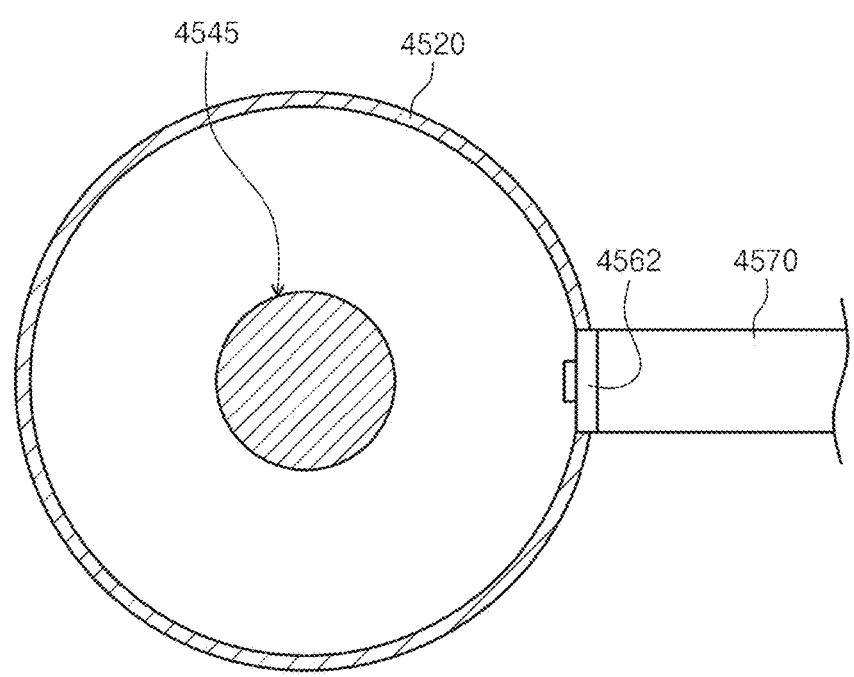
FIG. 16 is a diagram schematically illustrating the cover and a flow cover of FIG. 15 viewed from the top.

FIG. 15 is a diagram schematically illustrating an irradiating module according to another exemplary embodiment of FIG. 4 viewed from the front. FIG. 16 is a diagram schematically illustrating the cover and a flow cover of FIG. 15 viewed from the top. Referring to FIGS. 15 and 16, the irradiating module 450 according to the exemplary embodiment of the present invention may include a housing 4510, a cover 4520, a moving unit 4530, a laser unit 4540, and a photographing unit 4550, a cooling unit 4560, and a flow cover 4570.

A purge port 4512 may be formed on the bottom surface of the housing 4510. The purge port 4512 may communicate with a flow space of the flow cover 4570 to be described later. A discharge flow path 4566, which will be described later, may be connected to the purge port 4512. The cooling fluid passing through the flow path (not illustrated) formed in the plate 4562 may be supplied to the flow space of the flow cover 4570 through the discharge flow path 4566 and the purge port 4512.

A supply port 4526 may be formed on a side surface of the cover 4520. For example, as illustrated in FIG. 16, the supply port 4526 may be formed in one side surface of the cover 4520 corresponding to the central axis of the irradiation end 4545 with respect to the central axis of the irradiation end 4545 when viewed from the top. When the side hole 4524 is formed in the cover 4520, the supply port 4526 may be disposed at a position at which the supply port 4526 does not overlap the side hole 4524 with each other.

The supply port 4526 may communicate with the flow space formed inside the flow cover 4570 to be described later. Accordingly, the cooling fluid passing through the flow path (not illustrated) formed inside the plate 4562 sequentially passes through the discharge flow path 4566, the purge port 4512, the flow space of the flow cover 4570, and the supply port 4526 to be introduced into the inner space of the cover 4520.

The discharge flow path 4566 of the cooling unit 4560 is located in the accommodation space of the housing 4510.

One end of the discharge flow path 4566 may be connected to the other end (not illustrated) of the flow path formed inside the plate 4562, and the other end of the discharge flow path 4566 may be connected with the purge port 4512 formed on the bottom surface of the housing 4510.

The flow cover 4570 may connect the cover 4520 and the housing 4510 to each other. The flow cover 4570 may be coupled to a side surface of the cover 4520. When the side hole 4524 is formed in the cover 4520, the flow cover 4570 may be coupled to the side surface of the cover 4520 at a position at which the flow cover 4570 does not overlap the side hole 4524. The flow cover 4570 is located at the lower end of the housing 4510. The flow cover 4570 may connect the purge port 4512 and the supply port 4526. The flow space is formed inside the flow cover 4570. The flow space functions as a space in which the cooling fluid flows. The flow space may be in communication with the purge port 4512 and the supply port 4526, respectively.

Figure 17:
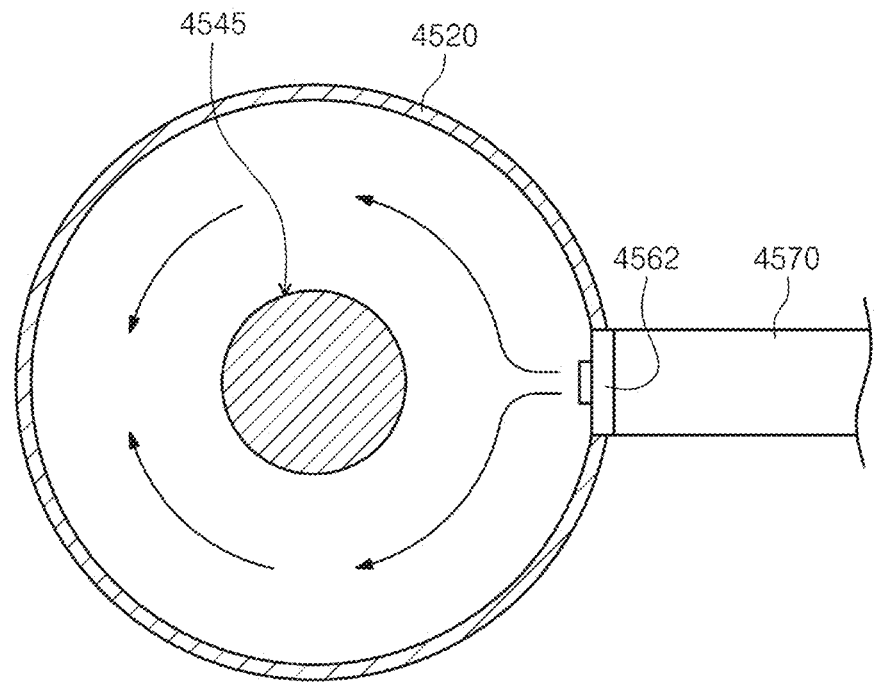
FIG. 17 is a diagram schematically illustrating a state in which a cooling fluid flows in the irradiating module of FIG. 15.

FIG. 17 is a diagram schematically illustrating a state in which the cooling fluid flows in the irradiating module of FIG. 15. Referring to FIG. 17, the cooling fluid which has been heat-exchanged with the laser unit 4540 while flowing through the flow path (not illustrated) formed inside the plate 4562 is discharged to the discharge flow path 4566. The cooling fluid supplied from the discharge flow path 4566 connected to the purge port 4512 flows in the flow space of the flow cover 4570. The cooling fluid supplied from the purge port 4512 is supplied to the supply port 4526 through the flow space of the flow cover 4570. The cooling fluid supplied to the supply port 4526 is supplied to the inner space of the cover 4520. The cooling fluid introduced into the inner space is discharged to the outside of the irradiating module 450 through the opening 4522 formed at the lower end of the cover 4520.

According to the exemplary embodiment of the present invention, the cooling fluid may be supplied to the side surface of the cover 4520 through the flow space of the flow cover 4570. The cooling fluid may be smoothly transferred to the inner space of the cover 4520. Accordingly, it is possible to efficiently block the liquid and/or particles introduced from the opening 4522 formed at the lower end of the cover 4520.

Figure 18:
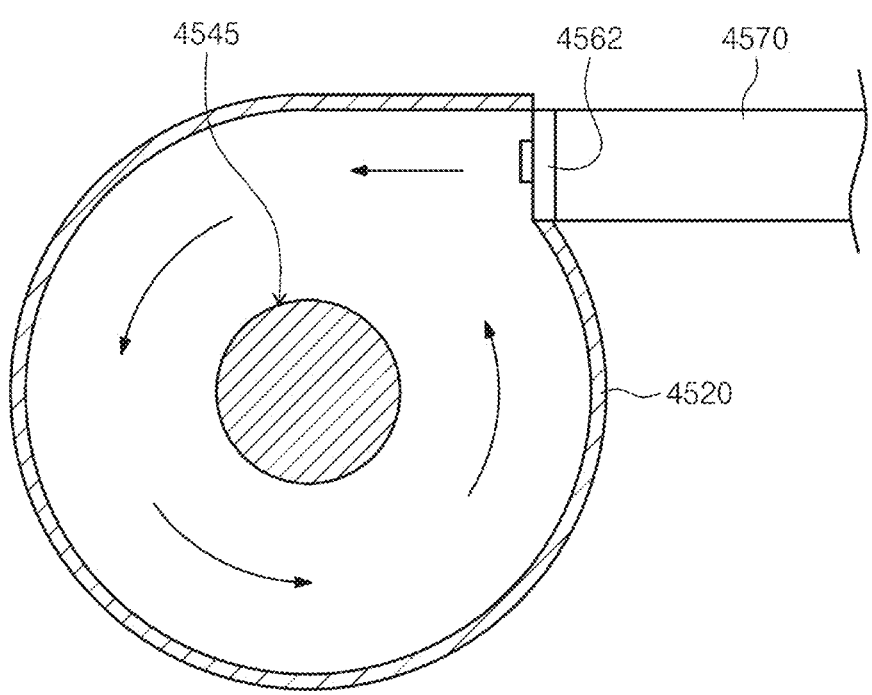
FIG. 18 is a diagram schematically illustrating the cover and the flow cover of FIG. 15 according to another exemplary viewed from the top.

FIG. 18 is a diagram schematically illustrating the cover and the flow cover of FIG. 15 according to another exemplary embodiment viewed from the top. Referring to FIG. 18, the supply port 4526 formed on one side surface of the cover 4520 may be positioned to be spaced apart from the central axis of the irradiation end 4545 with respect to the central axis of the irradiation end 4545 when viewed from the top. Since the supply port 4526 is installed to be spaced apart from the central axis of the irradiation end 4545, the cooling fluid supplied to the inner space of the cover 4520 may rotate and flow in the inner space. That is, the cooling fluid supplied from the supply port 4526 may form a rotational flow in the inner space of the cover 4520.

According to the above-described exemplary embodiment of the present invention, even though the supply port 4526 for supplying the cooling fluid to the inner space of the cover 4520 is installed on one side surface of the cover 4520, the cooling fluid may flow while generating a rotational flow within the inner space of the cover 4520, and may flow uniformly in a spiral direction within the inner space of the cover 4520. Accordingly, it is possible to effectively prevent the liquid and/or particles generated during the process from being introduced into the inner space of the cover 4520.

In the above-described exemplary embodiment of the present invention, the present invention has been described based on the case where an etch rate of the second pattern P2 is improved on the substrate M having the first pattern P1 as the monitoring pattern for monitoring the exposure pattern and the second pattern P2 that is the pattern for setting conditions for treating the substrate as the example. However, unlike this, the functions of the first pattern P1 and the second pattern P2 may be different from those of the above-described exemplary embodiment of the present invention. In addition, according to the exemplary embodiment of the present invention, only one of the first pattern P1 and the second pattern P2 may be provided, and the etch rate of one provided pattern between the first pattern P1 and the second pattern P2 may be improved. In addition, according to the exemplary embodiment of the present invention, the same may be applied to improve an etch rate of a specific region in a substrate, such as a wafer or glass, in addition to a photomask.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating apparatus, comprising:
a support unit configured to support and rotate a substrate in a treatment space;
a liquid supply unit configured to supply a liquid to the substrate supported by the support unit; and
an irradiating module configured to irradiate light to the substrate supported by the support unit,
wherein the irradiating module includes
a housing having an accommodation space,
a laser unit in the accommodation space, the laser unit including a laser irradiation unit configured to irradiate laser light and an irradiation end having one end protruding from the housing and configured to irradiate the laser light irradiated from the laser irradiation unit to the substrate supported by the support unit,
a cooling unit in the accommodation space, the cooling unit configured to cool the laser irradiation unit, and
a cover having an inner space and configured to accommodate therein the one end of the irradiation end protruding from the housing.

2. The substrate treating apparatus of claim 1,
the cover includes an opening on a bottom surface thereof at a position overlapping the laser light irradiated from the irradiation end, when viewed from a top.

3. The substrate treating apparatus of claim 2, wherein a boundary of the opening is rounded from an upper end of the bottom surface to a lower end of the bottom surface.

4. The substrate treating apparatus of claim 2, wherein the cover includes one or a plurality of side holes defined on a side surface thereof.

5. The substrate treating apparatus of claim 3, wherein the cooling unit includes a plate having a flow path through which a cooling fluid is configured to flow therein, and the flow path is configured to pass the cooling fluid therethrough and flow into the inner space.

6. The substrate treating apparatus of claim 5, wherein one end of the flow path is between an outer surface of the irradiation end and an inner surface of the housing.

7. The substrate treating apparatus of claim 5, wherein a purge port connected to one end of the flow path is at a lower end of the housing, a supply port configured to supply the cooling fluid to the inner space is on a side surface of the cover, and the substrate treating apparatus further comprises a flow cover which is coupled to the side surface of the cover to connect the purge port and the supply port, and has a flow space in which the cooling fluid flows therein.

8. The substrate treating apparatus of claim 7, wherein the supply port is at a position spaced apart from a central axis of the irradiation end when viewed from a front.

9. The substrate treating apparatus of claim 1, further comprising:

a photographing unit configured to photograph the laser light irradiated from the laser unit, wherein the photographing unit is in the accommodation space.

10. The substrate treating apparatus of claim 9, wherein the laser unit further includes a beam expander configured to control a characteristic of the laser light irradiated by the laser irradiation unit, and the photographing unit includes an image unit photographing the laser light irradiated by the laser unit and/or an image of the substrate, and a lighting unit providing light so that the image unit acquires the image, and when viewed from a top, an irradiation direction of the laser light, a photographing direction of the image unit, and an irradiation direction of the light are coaxial.

11. An irradiating module for irradiating light to a substrate, the irradiating module comprising:

a housing having an accommodation space;

a laser unit in the accommodation space, the laser unit including a laser irradiation unit configured to irradiate laser light and an irradiation end having one end protruding from the housing and configured to irradiate the laser light irradiated from the laser irradiation unit to the substrate supported by a support unit; and a cooling unit in the accommodation space and in contact with the laser irradiation unit, the cooling unit configured to exchange heat with the laser irradiation unit.

12. The irradiating module of claim 11, further comprising:

a cover having an inner space configured to accommodate therein one end of the irradiation end protruding from the housing, wherein the cover includes an opening on a bottom surface thereof at a position overlapping the laser light irradiated from the irradiation end, when viewed from a top.

13. The irradiating module of claim 12, wherein the cooling unit includes:

a plate include a flow path through which a cooling fluid exchanging heat with the laser irradiation unit is configured to flow; and the plate is in contact with the laser irradiation unit.

14. The irradiating module of claim 13, wherein the flow path is configured to pass the cooling fluid therethrough and supply to the inner space.

15. The irradiating module of claim 14, wherein a boundary of the opening is curved from an upper end of the bottom surface to a lower end of the bottom surface.

16. The irradiating module of claim 14, wherein the cover includes at least one side hole at a side surface thereof.

17. A substrate treating apparatus for treating a mask including a plurality of cells, the substrate treating apparatus comprising:

a support unit configured to support and rotate a mask in which a first pattern is in each of the plurality of cells and a second pattern different from the first pattern is outside the cells;

a liquid supply unit configured to supply a liquid to the mask supported by the support unit; and an irradiating module configured to irradiate light to the substrate supported by the support unit, wherein the irradiating module includes a housing having an accommodation space, a laser unit in the accommodation space, the laser unit including a laser irradiation unit configured to irradiate laser light and an irradiation end having one end protruding from the housing and configured to irradiate the laser light irradiated from the laser irradiation unit to the second pattern between the first pattern and the second pattern, a cooling unit in the accommodation space and including a flow path configured to exchange heat with the laser irradiation unit, and a cover having an inner space configured to accommodate therein one end of the irradiation end protruding from the housing, and an opening is a position overlapping the laser light irradiated from the irradiation end on a bottom surface of the cover when viewed from a top.

18. The substrate treating apparatus of claim 17, wherein the flow path is configured to pass a cooling fluid therethrough and supply to the inner space.

19. The substrate treating apparatus of claim 18, wherein the opening is rounded from an upper end of the bottom surface to a lower end of the bottom surface.

20. The substrate treating apparatus of claim 18, wherein the cover includes one or a plurality of side holes on a side surface thereof.

* * * * *